(12) United States Patent
Shang et al.

(10) Patent No.: US 6,765,178 B2
(45) Date of Patent: Jul. 20, 2004

(54) CHAMBER FOR UNIFORM SUBSTRATE HEATING

(75) Inventors: Quanyuan Shang, Saratoga, CA (US); Janine Kardokus, San Jose, CA (US); Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/025,152

(22) Filed: Dec. 18, 2001

(65) Prior Publication Data

US 2002/0086260 A1 Jul. 4, 2002

Related U.S. Application Data

(60) Provisional application No. 60/259,035, filed on Dec. 29, 2000.

(51) Int. Cl.[7] .............................. F27B 5/14; C23C 16/00
(52) U.S. Cl. ....................... 219/405; 219/390; 219/411; 219/392; 219/409; 118/724; 118/725; 118/50.1; 392/416; 392/418
(58) Field of Search ................................. 219/390, 392, 219/405, 411, 409; 392/416, 418; 118/724, 725, 50.1

(56) References Cited

U.S. PATENT DOCUMENTS

| | | | |
|---|---|---|---|
| 3,862,397 A | * 1/1975 | Anderson et al. ............ 219/405 |
| 4,058,430 A | 11/1977 | Suntola et al. .............. 156/611 |
| 4,389,973 A | 6/1983 | Suntola et al. .............. 118/725 |
| 4,413,022 A | 11/1983 | Suntola et al. ............ 427/255.2 |
| 4,486,487 A | 12/1984 | Skarp ......................... 428/216 |
| 4,767,494 A | 8/1988 | Kobayashi et al. ......... 156/606 |
| 4,806,321 A | 2/1989 | Nishizawa et al. ......... 422/245 |
| 4,813,846 A | 3/1989 | Helms ..................... 414/744.1 |
| 4,829,022 A | 5/1989 | Kobayashi et al. ......... 437/107 |
| 4,834,831 A | 5/1989 | Nishizawa et al. ......... 156/611 |
| 4,838,983 A | 6/1989 | Schumaker et al. ........ 156/613 |
| 4,838,993 A | 6/1989 | Aoki et al. ................. 156/643 |

(List continued on next page.)

FOREIGN PATENT DOCUMENTS

| | | | | |
|---|---|---|---|---|
| DE | 196 27 017 | 1/1997 | ......... H01L/21/283 |
| DE | 198 20 147 | 7/1999 | ....... H01L/21/3205 |
| EP | 0 344 352 A1 | 12/1989 | ........... H01L/39/24 |
| EP | 0 429 270 A2 | 5/1991 | ............. G03F/7/36 |
| EP | 0 442 490 A1 | 8/1991 | ........... C30B/25/02 |

(List continued on next page.)

OTHER PUBLICATIONS

Hultman, et al., "Review of the thermal and mechanical stability of TiN–based thin films", *Zeitschrift Fur Metallkunde*, 90(10) (Oct. 1999), pp. 803–813.

Klaus, et al., "Atomic Layer Deposition of $SiO_2$ Using Catalyzed and Uncatalyzed Self–Limiting Surface Reactions", *Surface Review & Letters*, 6(3&4) (1999), pp. 435–448.

Yamaguchi, et al., "Atomic–layer chemical–vapor–deposition of silicon dioxide films with extremely low hydrogen content", *Appl. Surf. Sci.*, vol. 130–132 (1998), pp. 202–207.

George, et al., "Surface Chemistry for Atomic Layer Growth", *J. Phys. Chem.*, vol. 100 (1996), pp. 13121–13131.

(List continued on next page.)

*Primary Examiner*—Shawntina Fuqua
(74) *Attorney, Agent, or Firm*—Moser, Patterson & Sheridan, LLP

(57) ABSTRACT

Embodiments of the invention generally provide an apparatus and a method for providing a uniform thermal profile to a plurality of substrates during heat processing. In one embodiment, a cassette containing one or more heated substrate supports is moveably disposed within a heating chamber having an about uniform thermal profile therein to more uniformly heat the substrates.

29 Claims, 10 Drawing Sheets

U.S. PATENT DOCUMENTS

| | | | |
|---|---|---|---|
| 4,840,921 A | 6/1989 | Matsumoto | 437/89 |
| 4,845,049 A | 7/1989 | Sunakawa | 437/81 |
| 4,859,307 A | 8/1989 | Nishizawa et al. | 437/81 |
| 4,859,627 A | 8/1989 | Sunakawa | 437/81 |
| 4,861,417 A | 8/1989 | Mochizuki et al. | 156/610 |
| 4,876,218 A | 10/1989 | Pessa et al. | 437/107 |
| 4,917,556 A | 4/1990 | Stark et al. | 414/217 |
| 4,927,670 A | 5/1990 | Erbil | 427/255.3 |
| 4,931,132 A | 6/1990 | Aspnes et al. | 156/601 |
| 4,951,601 A | 8/1990 | Maydan et al. | 118/719 |
| 4,960,720 A | 10/1990 | Shimbo | 437/105 |
| 4,975,252 A | 12/1990 | Nishizawa et al. | 422/245 |
| 4,993,357 A | 2/1991 | Scholz | 118/715 |
| 5,000,113 A | 3/1991 | Wang et al. | 118/723 |
| 5,013,683 A | 5/1991 | Petroff et al. | 437/110 |
| 5,028,565 A | 7/1991 | Chang et al. | 437/192 |
| 5,082,798 A | 1/1992 | Arimoto | 437/108 |
| 5,085,885 A | 2/1992 | Foley et al. | 477/38 |
| 5,091,320 A | 2/1992 | Aspnes et al. | 437/8 |
| 5,130,269 A | 7/1992 | Kitahara et al. | 437/111 |
| 5,166,092 A | 11/1992 | Mochizuki et al. | 437/105 |
| 5,173,474 A | 12/1992 | Connell et al. | 505/1 |
| 5,186,718 A | 2/1993 | Tepman et al. | 29/25.01 |
| 5,205,077 A | 4/1993 | Wittstock | 51/165 R |
| 5,225,366 A | 7/1993 | Yoder | 437/108 |
| 5,234,561 A | 8/1993 | Randhawa et al. | 204/192.38 |
| 5,246,536 A | 9/1993 | Nishizawa et al. | 156/610 |
| 5,250,148 A | 10/1993 | Nishizawa et al. | 156/611 |
| 5,254,207 A | 10/1993 | Nishizawa et al. | 156/601 |
| 5,256,244 A | 10/1993 | Ackerman | 156/613 |
| 5,259,881 A | 11/1993 | Edwards et al. | 118/719 |
| 5,270,247 A | 12/1993 | Sakuma et al. | 437/133 |
| 5,278,435 A | 1/1994 | Van Hove et al. | 257/184 |
| 5,281,274 A | 1/1994 | Yoder | 118/697 |
| 5,286,296 A | 2/1994 | Sato et al. | 118/719 |
| 5,290,748 A | 3/1994 | Knuuttila et al. | 502/228 |
| 5,294,286 A | 3/1994 | Nishizawa et al. | 156/610 |
| 5,296,403 A | 3/1994 | Nishizawa et al. | 437/133 |
| 5,300,186 A | 4/1994 | Kitahara et al. | 156/613 |
| 5,311,055 A | 5/1994 | Goodman et al. | 257/593 |
| 5,316,615 A | 5/1994 | Copel | 117/95 |
| 5,316,793 A | 5/1994 | Wallace et al. | 427/248.1 |
| 5,330,610 A | 7/1994 | Eres et al. | 117/86 |
| 5,336,324 A | 8/1994 | Stall et al. | 118/719 |
| 5,338,389 A | 8/1994 | Nishizawa et al. | 117/89 |
| 5,348,911 A | 9/1994 | Jurgensen et al. | 117/91 |
| 5,374,570 A | 12/1994 | Nasu et al. | 437/40 |
| 5,395,791 A | 3/1995 | Cheng et al. | 437/105 |
| 5,438,952 A | 8/1995 | Otsuka | 117/84 |
| 5,439,876 A | 8/1995 | Graf et al. | 505/447 |
| 5,441,703 A | 8/1995 | Jurgensen | 422/129 |
| 5,443,033 A | 8/1995 | Nishizawa et al. | 117/86 |
| 5,443,647 A | 8/1995 | Aucoin et al. | 118/723 ME |
| 5,455,072 A | 10/1995 | Bension et al. | 427/255.7 |
| 5,458,084 A | 10/1995 | Thorne et al. | 117/89 |
| 5,469,806 A | 11/1995 | Mochizuki et al. | 117/97 |
| 5,480,818 A | 1/1996 | Matsumoto et al. | 437/40 |
| 5,483,919 A | 1/1996 | Yokoyama et al. | 117/89 |
| 5,484,664 A | 1/1996 | Kitahara et al. | 428/641 |
| 5,503,875 A | 4/1996 | Imai et al. | 427/255.3 |
| 5,521,126 A | 5/1996 | Okamura et al. | 437/235 |
| 5,527,733 A | 6/1996 | Nishizawa et al. | 437/160 |
| 5,532,511 A | 7/1996 | Nishizawa et al. | 257/627 |
| 5,540,783 A | 7/1996 | Eres et al. | 118/725 |
| 5,561,735 A | 10/1996 | Camm | 392/416 |
| 5,567,152 A * | 10/1996 | Morimoto | 432/241 |
| 5,580,380 A | 12/1996 | Liu et al. | 117/86 |
| 5,601,651 A | 2/1997 | Watabe | 118/715 |
| 5,609,689 A | 3/1997 | Kato et al. | 118/719 |
| 5,616,181 A | 4/1997 | Yamamoto et al. | 118/723 ER |
| 5,637,530 A | 6/1997 | Gaines et al. | 114/105 |
| 5,641,984 A | 6/1997 | Aftergut et al. | 257/433 |
| 5,644,128 A | 7/1997 | Wollnik et al. | 250/251 |
| 5,667,592 A | 9/1997 | Boitnott et al. | 118/719 |
| 5,674,786 A | 10/1997 | Turner et al. | 437/225 |
| 5,693,139 A | 12/1997 | Nishizawa et al. | 117/89 |
| 5,695,564 A | 12/1997 | Imahashi | 118/719 |
| 5,705,224 A | 1/1998 | Murota et al. | 427/248.1 |
| 5,707,880 A | 1/1998 | Aftergut et al. | 437/3 |
| 5,711,811 A | 1/1998 | Suntola et al. | 118/711 |
| 5,730,801 A | 3/1998 | Tepman et al. | 118/719 |
| 5,730,802 A | 3/1998 | Ishizumi et al. | 118/719 |
| 5,747,113 A | 5/1998 | Tsai | 427/255.5 |
| 5,749,974 A | 5/1998 | Habuka et al. | 118/725 |
| 5,788,447 A | 8/1998 | Yonemitsu et al. | 414/217 |
| 5,788,799 A | 8/1998 | Steger et al. | 156/345 |
| 5,796,116 A | 8/1998 | Nakata et al. | 257/66 |
| 5,801,634 A | 9/1998 | Young et al. | 340/635 |
| 5,807,792 A | 9/1998 | Ilg et al. | 438/758 |
| 5,830,270 A | 11/1998 | McKee et al. | 117/106 |
| 5,835,677 A | 11/1998 | Li et al. | 392/401 |
| 5,850,071 A * | 12/1998 | Makiguchi et al. | 219/390 |
| 5,851,849 A | 12/1998 | Comizzoli et al. | 438/38 |
| 5,855,675 A | 1/1999 | Doering et al. | 118/719 |
| 5,855,680 A | 1/1999 | Soininen et al. | 118/719 |
| 5,856,219 A | 1/1999 | Naito et al. | 438/241 |
| 5,858,102 A | 1/1999 | Tsai | 118/719 |
| 5,866,213 A | 2/1999 | Foster et al. | 427/573 |
| 5,866,795 A | 2/1999 | Wang et al. | 73/1.36 |
| 5,879,459 A | 3/1999 | Gadgil et al. | 118/715 |
| 5,882,165 A | 3/1999 | Maydan et al. | 414/217 |
| 5,882,413 A | 3/1999 | Beaulieu et al. | 118/719 |
| 5,904,565 A | 5/1999 | Nguyen et al. | 438/687 |
| 5,916,365 A | 6/1999 | Sherman | 117/92 |
| 5,923,056 A | 7/1999 | Lee et al. | 257/192 |
| 5,923,985 A | 7/1999 | Aoki et al. | 438/301 |
| 5,925,574 A | 7/1999 | Aoki et al. | 437/31 |
| 5,928,389 A | 7/1999 | Jevtic | 29/25.01 |
| 5,942,040 A | 8/1999 | Kim et al. | 118/726 |
| 5,947,710 A | 9/1999 | Cooper et al. | 418/63 |
| 5,972,430 A | 10/1999 | DiMeo, Jr. et al. | 427/255.32 |
| 6,001,669 A | 12/1999 | Gaines et al. | 438/102 |
| 6,015,590 A | 1/2000 | Suntola et al. | 427/255.23 |
| 6,025,627 A | 2/2000 | Forbes et al. | 257/321 |
| 6,036,773 A | 3/2000 | Wang et al. | 117/97 |
| 6,042,652 A | 3/2000 | Hyun et al. | 118/719 |
| 6,043,177 A | 3/2000 | Falconer et al. | 502/4 |
| 6,046,439 A | 4/2000 | Johnsgard et al. | 219/444.1 |
| 6,051,286 A | 4/2000 | Zhao et al. | 427/576 |
| 6,062,798 A | 5/2000 | Muka | 414/416 |
| 6,071,808 A | 6/2000 | Merchant et al. | 438/633 |
| 6,084,302 A | 7/2000 | Sandhu | 257/751 |
| 6,086,677 A | 7/2000 | Umotoy et al. | 118/715 |
| 6,110,556 A | 8/2000 | Bang et al. | 428/64.1 |
| 6,113,977 A | 9/2000 | Soininen et al. | 427/64 |
| 6,117,244 A | 9/2000 | Bang et al. | 118/715 |
| 6,124,158 A | 9/2000 | Dautartas et al. | 438/216 |
| 6,130,147 A | 10/2000 | Major et al. | 438/604 |
| 6,139,700 A | 10/2000 | Kang et al. | 204/192.17 |
| 6,140,237 A | 10/2000 | Chan et al. | 438/687 |
| 6,140,238 A | 10/2000 | Kitch | 438/687 |
| 6,143,659 A | 11/2000 | Leem | 438/688 |
| 6,144,060 A | 11/2000 | Park et al. | 257/310 |
| 6,147,334 A | 11/2000 | Hannigan | 219/544 |
| 6,151,447 A | 11/2000 | Moore et al. | 392/418 |
| 6,158,446 A | 12/2000 | Mohindra et al. | 134/25.4 |
| 6,174,377 B1 | 1/2001 | Doering et al. | 118/729 |
| 6,174,809 B1 | 1/2001 | Kang et al. | 438/682 |
| 6,183,563 B1 | 2/2001 | Choi et al. | 118/715 |
| 6,200,893 B1 | 3/2001 | Sneh | 438/685 |
| 6,203,613 B1 | 3/2001 | Gates et al. | 117/104 |

| | | | |
|---|---|---|---|
| 6,206,967 B1 | 3/2001 | Mak et al. | 118/666 |
| 6,207,302 B1 | 3/2001 | Sugiura et al. | 428/690 |
| 6,231,672 B1 | 5/2001 | Choi et al. | 118/715 |
| 6,248,605 B1 | 6/2001 | Harkonen et al. | 438/29 |
| 6,270,572 B1 | 8/2001 | Kim et al. | 117/93 |
| 6,271,148 B1 | 8/2001 | Kao et al. | 438/727 |
| 6,287,965 B1 | 9/2001 | Kang et al. | 438/648 |
| 6,291,876 B1 | 9/2001 | Stumborg et al. | 257/632 |
| 6,305,314 B1 | 10/2001 | Sneh et al. | 118/723 R |
| 6,306,216 B1 | 10/2001 | Kim et al. | 118/725 |
| 6,316,098 B1 | 11/2001 | Yitzchaik et al. | 428/339 |
| 6,369,361 B2 * | 4/2002 | Saito et al. | 219/390 |
| 6,447,607 B2 | 9/2002 | Soininen et al. | 117/200 |
| 6,478,872 B1 | 11/2002 | Chae et al. | 117/88 |
| 6,481,945 B1 | 11/2002 | Hasper et al. | 414/217 |
| 6,511,539 B1 | 1/2003 | Raaijmakers | 117/102 |
| 6,551,406 B2 | 4/2003 | Kilpi | 118/728 |
| 2001/0000866 A1 | 5/2001 | Sneh et al. | 118/723 R |
| 2001/0009140 A1 | 7/2001 | Bondestam et al. | 118/715 |
| 2001/0011526 A1 | 8/2001 | Doering et al. | 118/729 |
| 2001/0013312 A1 | 8/2001 | Soininen et al. | 117/86 |
| 2001/0014371 A1 | 8/2001 | Kilpi | 427/255.28 |
| 2001/0031562 A1 | 10/2001 | Raaijmakers et al. | 438/770 |
| 2001/0034123 A1 | 10/2001 | Jeon et al. | 438/643 |
| 2001/0041250 A1 | 11/2001 | Werkhoven et al. | 428/212 |
| 2001/0042523 A1 | 11/2001 | Kesala | 122/6.6 |
| 2001/0042799 A1 | 11/2001 | Kim et al. | 239/553 |
| 2001/0054377 A1 | 12/2001 | Lindfors et al. | 117/104 |
| 2002/0000196 A1 | 1/2002 | Park | 118/715 |
| 2002/0007790 A1 | 1/2002 | Park | 118/715 |
| 2002/0041931 A1 | 4/2002 | Suntola et al. | 427/255.28 |
| 2002/0052097 A1 | 5/2002 | Park | 438/507 |
| 2002/0086106 A1 | 7/2002 | Park et al. | 427/248.1 |
| 2002/0092471 A1 | 7/2002 | Kang et al. | 118/715 |
| 2002/0094689 A1 | 7/2002 | Park | 438/694 |
| 2002/0108570 A1 | 8/2002 | Lindfors | 118/715 |
| 2002/0134307 A1 | 9/2002 | Choi | 118/715 |
| 2003/0004723 A1 | 1/2003 | Chihara | 704/260 |
| 2003/0075273 A1 | 4/2003 | Kilpela et al. | 156/345.33 |
| 2003/0075925 A1 | 4/2003 | Lindfors et al. | 285/367 |

FOREIGN PATENT DOCUMENTS

| | | | | |
|---|---|---|---|---|
| EP | 0 799 641 A2 | 10/1997 | | B01J/20/32 |
| EP | 1167569 | 1/2002 | | C23C/16/455 |
| FR | 2 626 110 | 7/1989 | | H01L/39/24 |
| FR | 2 692 597 | 12/1993 | | C23C/16/00 |
| GB | 2 298 314 A | 8/1996 | | H01L/21/00 |
| GB | 2 355 727 A | 5/2001 | | C23C/16/44 |
| JP | 58-098917 | 6/1983 | | H01L/21/205 |
| JP | 58-100419 | 6/1983 | | H01L/21/20 |
| JP | 60-065712 A | 4/1985 | | C01B/33/113 |
| JP | 61-035847 | 2/1986 | | B01J/19/08 |
| JP | 61-210623 | 9/1986 | | H01L/21/205 |
| JP | 62-069508 | 3/1987 | | H01L/21/203 |
| JP | 62-091495 A | 4/1987 | | C30B/25/02 |
| JP | 62-141717 | 6/1987 | | H01L/21/203 |
| JP | 62-167297 | 7/1987 | | C30B/29/40 |
| JP | 62-171999 | 7/1987 | | C30B/29/40 |
| JP | 62-232919 | 10/1987 | | H01L/21/205 |
| JP | 63-062313 | 3/1988 | | H01L/21/203 |
| JP | 63-085098 | 4/1988 | | C30B/21/40 |
| JP | 63-090833 | 4/1988 | | H01L/21/365 |
| JP | 63-222420 | 9/1988 | | H01L/21/205 |
| JP | 63-222421 | 9/1988 | | H01L/21/205 |
| JP | 63-227007 | 9/1988 | | H01L/21/205 |
| JP | 63-252420 | 10/1988 | | H01L/21/205 |
| JP | 63-266814 | 11/1988 | | H01L/21/205 |
| JP | 64-009895 | 1/1989 | | C30B/29/40 |
| JP | 64-009896 | 1/1989 | | C30B/29/40 |
| JP | 64-009897 | 1/1989 | | C30B/29/40 |
| JP | 64-037832 | 2/1989 | | H01L/21/205 |
| JP | 64/082615 | 3/1989 | | H01L/21/205 |
| JP | 64/082617 | 3/1989 | | H01L/21/205 |
| JP | 64/082671 | 3/1989 | | H01L/29/78 |
| JP | 64-082676 | 3/1989 | | H01L/29/80 |
| JP | 01-103982 | 4/1989 | | C30B/23/08 |
| JP | 01-103996 | 4/1989 | | C30B/29/40 |
| JP | 64-090524 | 4/1989 | | H01L/21/205 |
| JP | 01-117017 | 5/1989 | | H01L/21/203 |
| JP | 01-143221 | 6/1989 | | H01L/21/314 |
| JP | 01-143233 | 6/1989 | | H01L/21/76 |
| JP | 01-154511 | 6/1989 | | H01L/21/20 |
| JP | 01-236657 | 9/1989 | | H01L/29/80 |
| JP | 01-245512 | 9/1989 | | H01L/21/205 |
| JP | 01-264218 | 10/1989 | | H01L/21/205 |
| JP | 01-270593 | 10/1989 | | C30B/25/02 |
| JP | 01-272108 | 10/1989 | | H01L/21/203 |
| JP | 01-290221 | 11/1989 | | H01L/21/205 |
| JP | 01-290222 | 11/1989 | | H01L/21/205 |
| JP | 01-296673 | 11/1989 | | H01L/29/88 |
| JP | 01-303770 | 12/1989 | | H01L/39/24 |
| JP | 01-305894 | 12/1989 | | C30B/23/08 |
| JP | 01-313927 | 12/1989 | | H01L/21/205 |
| JP | 02-012814 | 1/1990 | | H01L/21/205 |
| JP | 02-014513 | 1/1990 | | H01L/21/205 |
| JP | 02-017634 | 1/1990 | | H01L/21/225 |
| JP | 02-063115 | 3/1990 | | H01L/21/20 |
| JP | 02-074029 | 3/1990 | | H01L/21/205 |
| JP | 02-074587 | 3/1990 | | C30B/23/08 |
| JP | 02-106822 | 4/1990 | | H01B/13/00 |
| JP | 02-129913 | 5/1990 | | H01L/21/205 |
| JP | 02-162717 | 6/1990 | | H01L/21/20 |
| JP | 02-172895 | 7/1990 | | C30B/29/36 |
| JP | 02-196092 | 8/1990 | | C30B/25/14 |
| JP | 02-203517 | 8/1990 | | H01L/21/205 |
| JP | 02-230690 | 9/1990 | | H05B/33/10 |
| JP | 02-230722 | 9/1990 | | H01L/21/205 |
| JP | 02-246161 | 10/1990 | | H01L/29/784 |
| JP | 02-264491 | 10/1990 | | H01S/3/18 |
| JP | 02-283084 | 11/1990 | | H01S/3/18 |
| JP | 02-304916 | 12/1990 | | H01L/21/205 |
| JP | 03-019211 | 1/1991 | | H01L/21/205 |
| JP | 03-022569 | 1/1991 | | H01L/29/804 |
| JP | 03-023294 | 1/1991 | | C30B/25/18 |
| JP | 03-023299 | 1/1991 | | C30B/29/40 |
| JP | 03-044967 | 2/1991 | | H01L/29/48 |
| JP | 03-048421 | 3/1991 | | H01L/21/302 |
| JP | 03/070124 | 3/1991 | | H01L/21/205 |
| JP | 03-185716 | 8/1991 | | H01L/21/205 |
| JP | 03-208885 | 9/1991 | | C30B/23/02 |
| JP | 03-234025 | 10/1991 | | H01L/21/318 |
| JP | 03-286522 | 12/1991 | | H01L/21/205 |
| JP | 03-286531 | 12/1991 | | H01L/21/316 |
| JP | 04-031391 | 2/1992 | | C30B/23/08 |
| JP | 04-031396 | 2/1992 | | C30B/25/14 |
| JP | 04-031396 A | 2/1992 | | C30B/25/14 |
| JP | 04-100292 | 4/1992 | | H01S/3/18 |
| JP | 04-111418 | 4/1992 | | H01L/21/205 |
| JP | 04-132214 | 5/1992 | | H01L/21/205 |
| JP | 04-132681 | 5/1992 | | C30B/25/14 |
| JP | 04/151822 | 5/1992 | | H01L/21/205 |
| JP | 04-162418 | 6/1992 | | H01L/21/205 |
| JP | 04-175299 | 6/1992 | | C30B/29/68 |
| JP | 04-186824 | 7/1992 | | H01L/21/205 |
| JP | 04-212411 | 8/1992 | | H01L/21/203 |
| JP | 04-260696 | 9/1992 | | C30B/29/40 |
| JP | 04-273120 | 9/1992 | | H01L/21/20 |
| JP | 04-285167 | 10/1992 | | C23C/14/54 |
| JP | 04-291916 | 10/1992 | | H01L/21/205 |
| JP | 04-325500 | 11/1992 | | C30B/33/00 |
| JP | 04-328874 | 11/1992 | | H01L/29/804 |
| JP | 05-029228 | 2/1993 | | H01L/21/205 |

| | | | | | | | | |
|---|---|---|---|---|---|---|---|---|
| JP | 05-047665 | 2/1993 | H01L/21/205 | WO | 99/01595 | 1/1999 | C30B/25/14 |
| JP | 05-047666 | 2/1993 | H01L/21/205 | WO | 99/13504 | 3/1999 | H01L/21/68 |
| JP | 05-047668 | 2/1993 | H01L/21/205 | WO | 99/29924 A1 | 6/1999 | C23C/16/04 |
| JP | 05-074717 | 3/1993 | H01L/21/205 | WO | 99/41423 A2 | 8/1999 | |
| JP | 05-074724 | 3/1993 | H01L/21/205 | WO | 99/65064 | 12/1999 | H01L/21/00 |
| JP | 05-102189 | 4/1993 | H01L/21/336 | WO | 00/11721 | 3/2000 | H01L/29/43 |
| JP | 05-160152 | 6/1993 | H01L/21/336 | WO | 00/15865 A1 | 3/2000 | C23C/16/00 |
| JP | 05-175143 | 7/1993 | H01L/21/205 | WO | 00/15881 A2 | 3/2000 | |
| JP | 05-175145 | 7/1993 | H01L/21/205 | WO | 00/16377 A2 | 3/2000 | |
| JP | 05-182906 | 7/1993 | H01L/21/20 | WO | 00/54320 A1 | 9/2000 | H01L/21/44 |
| JP | 05-186295 | 7/1993 | C30B/25/02 | WO | 00/63957 A1 | 10/2000 | H01L/21/205 |
| JP | 05-206036 | 8/1993 | H01L/21/205 | WO | 00/79019 A1 | 12/2000 | C23C/16/00 |
| JP | 05-234899 | 9/1993 | H01L/21/205 | WO | 00/79576 A1 | 12/2000 | H01L/21/205 |
| JP | 05-235047 | 9/1993 | H01L/21/338 | WO | 01/15220 | 3/2001 | H01L/21/768 |
| JP | 05-251339 | 9/1993 | H01L/21/20 | WO | 01/15220 A1 | 3/2001 | H01L/21/768 |
| JP | 05-270997 | 10/1993 | C30B/29/68 | WO | 01/17692 | 3/2001 | B05C/11/00 |
| JP | 05-283336 | 10/1993 | H01L/21/20 | WO | 01/27346 A1 | 4/2001 | C23C/16/44 |
| JP | 05-291152 | 11/1993 | H01L/21/205 | WO | 01/27347 A1 | 4/2001 | C23C/16/44 |
| JP | 05-304334 | 11/1993 | H01L/3/18 | WO | 01/29280 A1 | 4/2001 | C23C/16/32 |
| JP | 05-343327 | 12/1993 | H01L/21/205 | WO | 01/29891 A1 | 4/2001 | H01L/21/768 |
| JP | 05-343685 | 12/1993 | H01L/29/784 | WO | 01/29893 A1 | 4/2001 | H01L/21/768 |
| JP | 06-045606 | 2/1994 | H01L/29/784 | WO | 01/36702 A1 | 5/2001 | C23C/16/00 |
| JP | 06-132236 | 5/1994 | H01L/21/205 | WO | 01/40541 A1 | 6/2001 | C23C/16/40 |
| JP | 06-177381 | 6/1994 | H01L/29/784 | WO | 01/66832 A2 | 9/2001 | C30B/16/44 |
| JP | 06-196809 | 7/1994 | H01S/3/18 | WO | 02/08488 | 1/2002 | C23C/16/44 |
| JP | 06-222388 | 8/1994 | G02F/1/136 | | | | |
| JP | 06-224138 | 8/1994 | H01L/21/205 | | | | |
| JP | 06-230421 | 8/1994 | G02F/1/136 | | | | |
| JP | 06-252057 | 9/1994 | H01L/21/205 | | | | |
| JP | 06-291048 | 10/1994 | H01L/21/205 | | | | |
| JP | 07-070752 | 3/1995 | C23C/16/40 | | | | |
| JP | 07-086269 | 3/1995 | H01L/21/314 | | | | |
| JP | 08-181076 | 7/1996 | H01L/21/205 | | | | |
| JP | 08-245291 | 9/1996 | C30B/25/14 | | | | |
| JP | 08-264530 | 10/1996 | H01L/21/3205 | | | | |
| JP | 09-260786 | 10/1997 | H01S/3/18 | | | | |
| JP | 09-293681 | 11/1997 | H01L/21/205 | | | | |
| JP | 10-188840 | 7/1998 | H01J/29/18 | | | | |
| JP | 10-190128 | 7/1998 | H01S/3/18 | | | | |
| JP | 10-308283 | 11/1998 | H05B/33/22 | | | | |
| JP | 11-269652 | 10/1999 | C23C/16/44 | | | | |
| JP | 2000-031387 | 1/2000 | H01L/27/04 | | | | |
| JP | 2000-058777 | 2/2000 | H01L/27/108 | | | | |
| JP | 2000-068072 | 3/2000 | H05B/33/22 | | | | |
| JP | 2000-087029 | 3/2000 | C09K/11/08 | | | | |
| JP | 2000-319772 | 3/2000 | C23C/16/00 | | | | |
| JP | 2000-138094 | 5/2000 | H05B/33/10 | | | | |
| JP | 2000-218445 | 8/2000 | B23P/6/00 | | | | |
| JP | 2000-319772 | 11/2000 | C23C/14/24 | | | | |
| JP | 2000-340883 | 12/2000 | H01S/5/125 | | | | |
| JP | 2000-353666 | 12/2000 | H01L/21/205 | | | | |
| JP | 2001-020075 | 1/2001 | C23C/16/44 | | | | |
| JP | 2001-62244 | 3/2001 | B01D/53/34 | | | | |
| JP | 2001-152339 | 6/2001 | C23C/16/40 | | | | |
| JP | 2001-172767 | 6/2001 | C23C/16/40 | | | | |
| JP | 2001-189312 | 7/2001 | H01L/21/316 | | | | |
| JP | 2001-217206 | 8/2001 | H01L/21/285 | | | | |
| JP | 2001-220287 | 8/2001 | C30B/25/02 | | | | |
| JP | 2001-220294 | 8/2001 | C30B/29/20 | | | | |
| JP | 2001-240972 | 9/2001 | C23C/16/458 | | | | |
| JP | 2001-254181 | 9/2001 | C23C/16/46 | | | | |
| JP | 2001-284042 | 10/2001 | H05B/33/04 | | | | |
| JP | 2001-303251 | 10/2001 | C23C/16/44 | | | | |
| JP | 2001-328900 | 11/2001 | C30B/29/68 | | | | |
| WO | 90/02216 | 3/1990 | C23C/14/34 | | | | |
| WO | 91/10510 A1 | 7/1991 | B01J/37/02 | | | | |
| WO | 93/02111 A1 | 2/1993 | C08F/4/78 | | | | |
| WO | 96/17107 A1 | 6/1996 | C23C/16/44 | | | | |
| WO | 96/18756 A1 | 6/1996 | C23C/16/08 | | | | |
| WO | 98/06889 | 2/1998 | | | | | |
| WO | 98/51838 | 11/1998 | C23C/16/06 | | | | |

OTHER PUBLICATIONS

George, et al., "Atomic layer controlled deposition of SiO$_2$ and Al$_2$O$_3$ using ABAB . . . binary reaction sequence chemistry", *Appl. Surf. Sci.*, vol. 82/83 (1994), pp. 460–467.

Wise, et al., "Diethyldiethoxysilane as a new precursor for SiO$_2$ growth on silicon", *Mat. Res. Soc. Symp. Proc.*, vol. 334 (1994), pp. 37–43.

Niinisto, et al., "Synthesis of oxide thin films and overlayers by atomic layer epitaxy for advanced applications", *Mat. Sci. & Eng.*, vol. B41 (1996), pp. 23–29.

Ritala, et al., "Perfectly conformal TiN and Al$_2$O$_3$ films deposited by atomic layer deposition", *Chemical Vapor Deposition*, vol. 5(1) (Jan. 1999), pp. 7–9.

Klaus, et al., "Atomically controlled growth of tungsten and tungsten nitride using sequential surface reactions". *Appl. Surf. Sci.*, vol. 162–163 (2000), pp. 479–491.

Min, et al., "Atomic layer deposition of TiN thin films by sequential introduction of Ti precursor and NH/sub3/", *Symp.: Advanced Interconnects and Contact Materials and Processes for Future Integrated Circuits* (Apr. 13–16, 1998), pp. 337–342.

Klaus, et al., Atomic Layer Deposition of Tungsten using Sequential Surface Chemistry with a Sacrificial Stripping Reaction, Thin Solid Films 360 (2000), pp. 145–153, (Accepted Nov. 16, 1999).

Min, et al., "Metal–Organic Atomic–Layer Deposition of Titanium–Silicon–Nitride Films", *Applied Physics Letters*, American Inst. Of Physics, vol. 75(11) (Sep. 13, 1999).

Martensson, et al., "Atomic Layer Epitaxy of Copper on Tantalum", *Chemical Vapor Deposition*, 3(1) (Feb. 1, 1997), pp. 45–50.

Ritala, et al. "Atomic Layer Epitaxy Growth of TiN Thin Films", *J. Electrochem. Soc.*, 142(8) (Aug. 1995), pp. 2731–2737.

Elers, et al., "NbC15 as a precursor in atomic layer epitaxy", *Appl. Surf. Sci.*, vol. 82/83 (1994), pp. 468–474.

Lee, "The Preparation of Titanium–Based Thin Film by CVD Using Titanium Chlorides as Precursors", *Chemical Vapor Deposition*, 5(2) (Mar. 1999), pp. 69–73.

Martensson, et al., "Atomic Layer Epitaxy of Copper, Growth & Selectivity in the Cu (II)–2,2.6,6–Tetramethyl–3, 5–Heptanedion ATE/H2 Process", *J. Electrochem. Soc.*, 145(8) (Aug. 1998), pp. 2926–2931.

Min, et al., "Chemical Vapor Deposition of Ti–Si–N Films with Alternating Source Supply", *Mat., Res. Soc. Symp. Proc.*, vol. 564 (Apr. 5, 1999), pp. 207–210.

Bedair, "Atomic layer epitaxy deposition processes", *J. Vac. Sci. Technol.* 12(1) (Jan./Feb. 1994).

Yamaga, et al., "Atomic layer epitaxy of ZnS by a new gas supplying system in a low–pressure metalorganic vapor phase epitaxy", *J. of Crystal Growth* 117 (1992), pp. 152–155.

Elam, et al., "Nucleation and growth during tungsten atomic layer deposition on SiO2 surfaces," Thin Solid Films 386 (2001) pp. 41–52, (Accepted Dec. 14, 2000).

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

Scheper, et al., "Low–temperature deposition of titanium nitride films from dialkylhydrazine–based precursors", Materials Science in Semiconductor Processing 2 (1999), pp. 149–157.

Suzuki, et al., "A 0.2–$\mu$m contact filing by 450° C.–hydrazine–reduced TiN film with low resistivity", IEDM 92–979, pp. 11.8.1–11.8.3.

Suzuki, et al., "LPCVD–TiN Using Hydrazine and $TiCl_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some $\beta$–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition / Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

Abstracts of articles—atomic layer deposition.

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor depositied titanium diboride", J. Appl. Phys. 69(11) (Jun. 1, 1991), pp. 7853–7861.

Choi, et al., "Stability of $TiB_2$ as a Diffusion Barrier on Silicon", J. Electrochem. Soc. 138(10) (Oct. 1991), pp. 3062–3067.

"Cluster Tools for Fabrication of Advanced devices" Jap. J. of Applied Physics, Extended Abstracts, $22^{nd}$ Conference Solid State Devices and Materials (1990), pp. 849–852.

"Applications of Integrated processing", Solid State Technology, US, Cowan Pub., vol. 37, No. 12 (Dec. 1, 1994), pp. 45–47.

Kitigawa, et al., "Hydrogen–mediated low temperature epitaxy of Si in plasma–enhanced chemical vapor deposition", Applied Surface Science (2000), pp. 30–34.

Lee, et al., "Pulsed nucleation for ultra–high aspect ratio tungsten plugfill", Novellus Systems, Inc. (2001), pp. 1–2 (*Copy Not Available to Applicant at This Time*).

International Search Report for PCT/US01/50262, dated Jul. 2, 2002.

International Preliminary Examination Report for PCT/US01/50262, dated Oct. 23, 2003.

* cited by examiner

CHAMBER FOR UNIFORM SUBSTRATE HEATING

CROSS-REFERENCE TO RELATED APPLICATIONS

This application claims benefit of U.S. provisional Patent Application Serial No. 60/259,035, filed Dec. 29, 2000, which is herein incorporated by reference.

BACKGROUND OF THE INVENTION

1. Field of the Invention

Aspects of the invention generally relate to an apparatus and method for heat processing substrates.

2. Background of the Related Art

In the fabrication of flat panel displays (FPD), thin film transistors (TFT) and liquid crystal cells, metal interconnects and other features are formed by depositing and removing multiple layers of conducting, semiconducting and dielectric materials from a glass substrate. The various features formed are integrated into a system that collectively is used to create, for example, active matrix display screens in which display states are electrically created in individual pixels on the FPD. Processing techniques used to create the FPD include plasma-enhanced chemical vapor deposition (PECVD), physical vapor deposition (PVD), etching, and the like. Plasma processing is particularly well suited for the production of flat panel displays because of the relatively lower processing temperatures required to deposit film and good film quality which results from plasma processes.

During FPD processing, proper heat processing of the film across the entire surface of the substrate is critical for the FPD to function properly. The heating temperature required varies depending on the type of film being processed, and process being performed. For example, one exemplary type of flat panel display film used in the construction of FPDs is low temperature poly silicon (LTPS). Part of the LTPS film processing requires the LTPS film be heated up to about 600° C. to remove hydrogen from the film whereas a similar heat treatment for amorphous silicon (α-Si) film requires a substantially lower temperature of up to 450° C.

Generally, the film heating process is highly temperature sensitive as temperature non-uniformity may cause insufficient removal of unwanted contaminates, resulting in peeling and ablation of the film. To compensate for temperature non-uniformity heating process times must be extended. Unfortunately, extending the heating process times increases the production cost and often results in unusable films if the process is not completed.

Conventional heating chambers provide heat processing by heating one or more substrates through a combination of gas conduction and heat radiation. Unfortunately, the chamber walls and other internal chamber components provide heat conduction paths within the chamber resulting in conductive heat losses. The conductive heat losses create a constantly fluctuating substrate-heating environment. As the temperatures are increased, conductive heat losses become more pronounced, exacerbating the heat non-uniformity within the substrate-heating environment. Moreover, conventional heating chambers are often very large to accommodate the substrate perimeter, further exacerbating the heating issues by increasing the area and volume to be heated. For example, as the demand for larger computer displays, monitors, flat-screen televisions, and the like increases a typical substrate may be 620 mm×750 mm, or larger. For instance, substrates of 1 meter×1 meter are contemplated. Typically, to compensate for the larger substrates, larger chamber volumes, and the subsequent increase in heat losses, more heating elements are used, thereby increasing the cost of the equipment, energy usage, and temperature non-uniformity. As temperatures increase, copper heating elements are often employed to offset energy costs and provide efficient heating. Copper heaters are generally more energy efficient than other types of heating elements. Unfortunately, as the temperatures are increased, copper atoms from the copper heaters often escape into the heating chamber and contaminate the film. Thus, traditional heating chambers and heating processes do not provide acceptably uniform and contaminant-free substrate heating for an efficient and cost effective substrate heating process.

Therefore, there is a need for a method and apparatus for uniformly heat processing a plurality of substrates in an efficient contaminate-free heat processing system.

SUMMARY OF THE INVENTION

Embodiments of the invention generally provide for the uniform heating of substrates within a heating chamber for use with substrate processing systems. In one aspect of the invention, substrates are uniformly heated within an insulated chamber having a body, a bottom portion, and a lid. The chamber also includes a heat reflector disposed within the chamber, a heater disposed within the chamber adjacent to the heat reflector and a plurality of heated supports movably disposed within the chamber to support at least two substrates within the chamber.

In another aspect of the invention, a method is provided for uniformly heating substrates, comprising supporting a plurality of substrates on a plurality of heated supports within a chamber slightly larger than and shaped to conform to the shape of the substrate support, providing a process temperature between about 450° C. and about 600° C., providing a vacuum within the chamber, and uniformly heating the substrates to a uniform temperature.

BRIEF DESCRIPTION OF THE DRAWINGS

So that the manner in which the recited embodiments of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention have particular advantages in a multi-chamber processing system also known as a cluster tool, commonly used in the semiconductor industry and well suited for supporting the substrate-heating chamber described herein. A cluster tool is a modular system comprising multiple chambers that perform various functions including substrate heating, center-finding and orientation, annealing, deposition and/or etching. The multiple chambers are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool.

Figure 1:
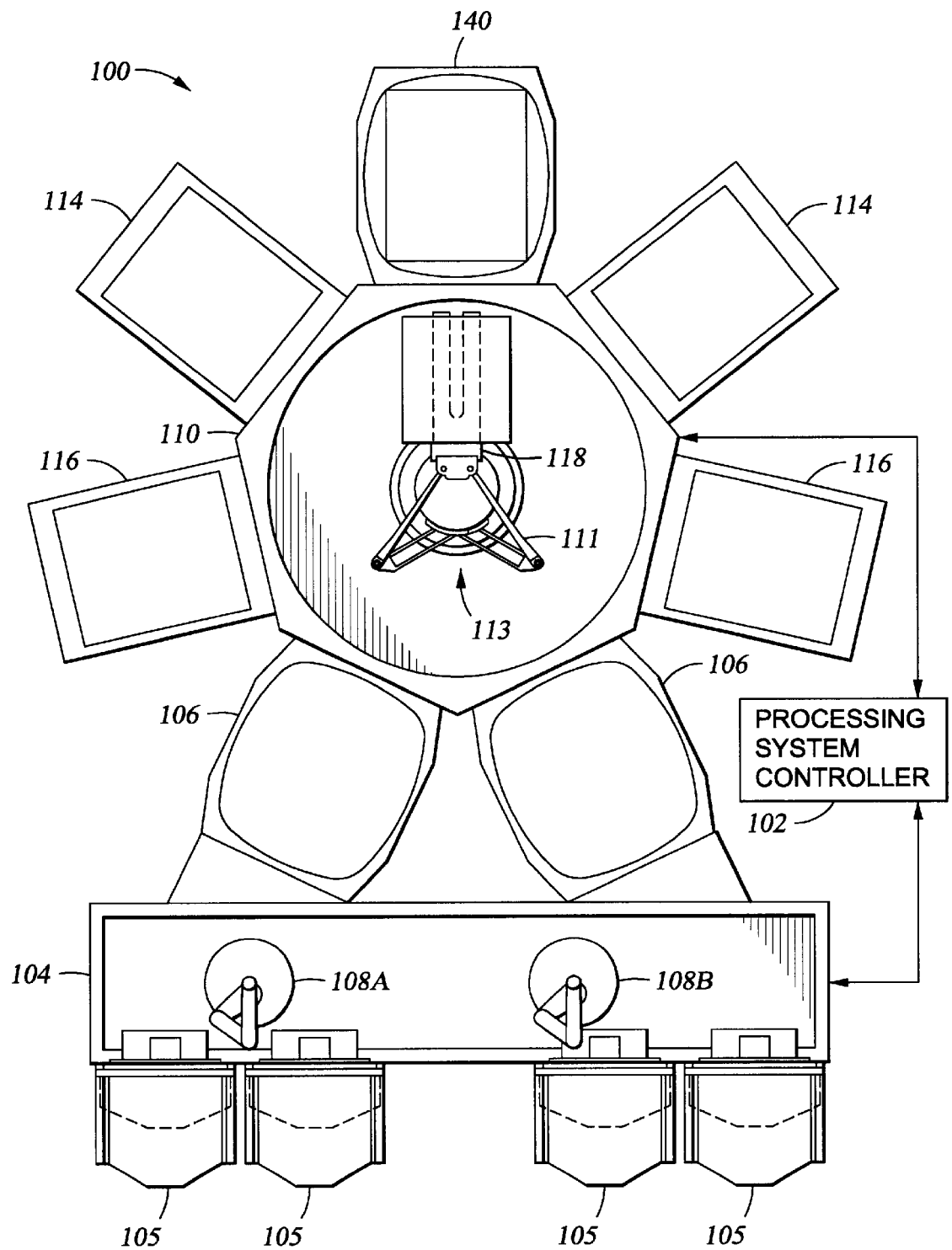
FIG. 1 is a plan view of a processing system including the heating chamber of the invention.

FIG. 1 is a plan view of a typical processing system 100 for semiconductor processing wherein the invention may be used to advantage. The processing system 100 generally comprises a plurality of chambers and robots and is preferably equipped with a process system controller 102 programmed to carry out the various processing methods performed in the processing system 100. A front-end environment 104 is shown positioned in selective communication with a pair of load lock chambers 106. Pod loaders 108A–B disposed in the front-end environment 104 are capable of linear, rotational, and vertical movement to shuttle substrates between the load locks 106 and a plurality of pods 105 which are mounted on the front-end environment 104.

The load locks 106 provide a first vacuum interface between the front-end environment 104 and a transfer chamber 110. Two load locks 106 are provided to increase throughput by alternatively communicating with the transfer chamber 110 and the front-end environment 104. Thus, while one load lock 106 communicates with the transfer chamber 110, a second load lock 106 communicates with the front-end environment 104.

A robot 113 is centrally disposed in the transfer chamber 110 to transfer substrates from the load locks 106 to one of the various processing chambers 114 or holding chambers 116. The processing chambers 114 are adapted to perform any number of processes such as film deposition, annealing, etching, and the like while the holding chambers 116 adapted for, orientation, cool down and the like. A heating chamber 140 used to heat substrates during a heat process such as hydrogen removal and annealing is disposed within processing system 100. The heating chamber 140 is located typically disposed within the processing system 100 in the most efficient processing position but may be located anywhere within processing system 100. For example, the heating process step may follow a deposition process step. Therefore, to minimize the movement of the robot 113, the heating chamber 140 may be located adjacent to one of the processing chambers 114 used for a deposition process step.

Figure 2:
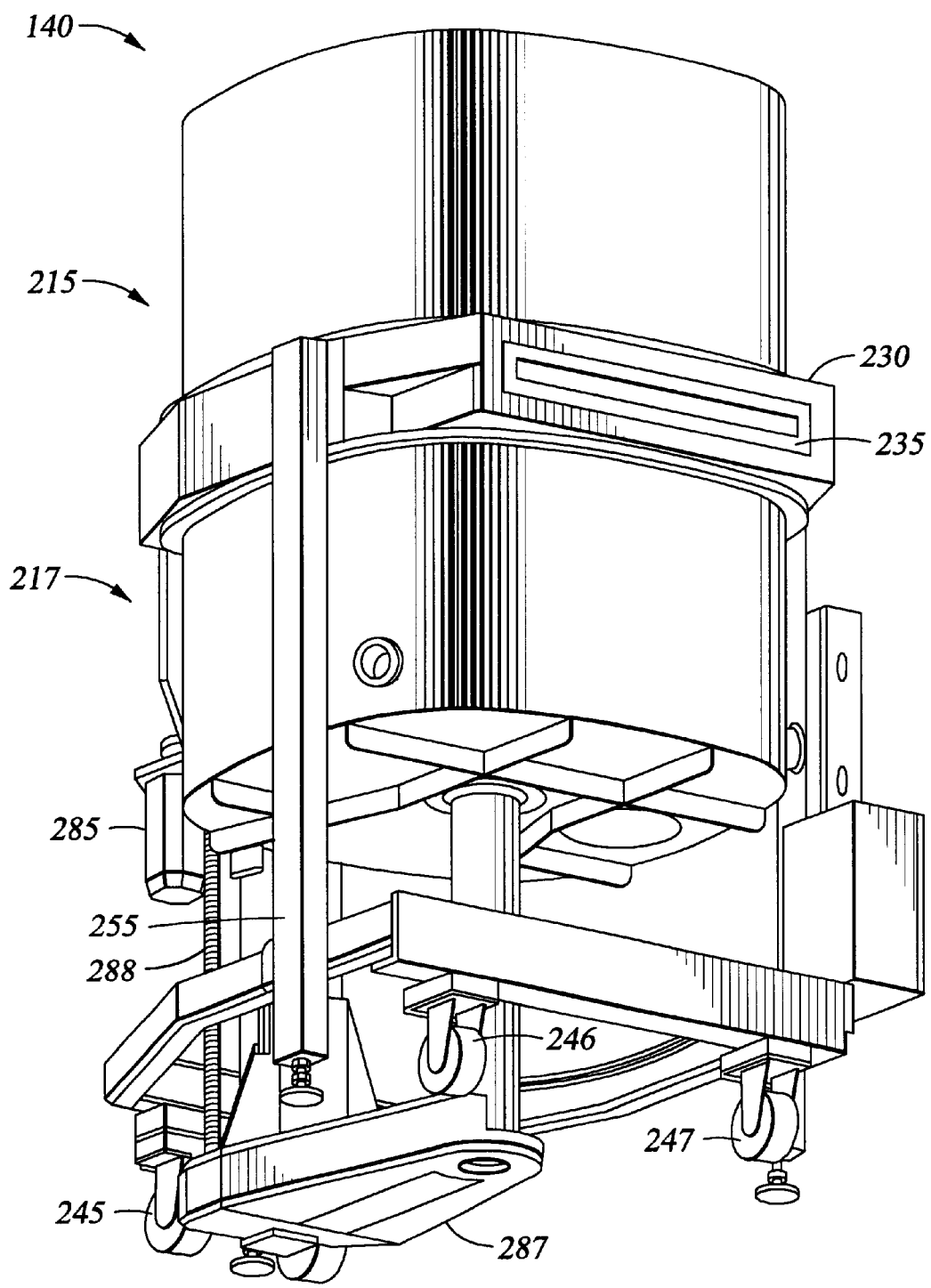
FIG. 2 is a perspective view of one embodiment of the heating chamber of FIG. 1.

FIG. 2 is a perspective view of the heating chamber 140 comprising an upper section 215 (e.g., upper bell jar) and a lower section 217 (e.g., lower bell jar) where the upper section 215 is separated from the lower section 217 by a connecting body 230 having a loading window 235. The upper and lower sections 215, 217 are sealably attached to and generally symmetrical and coaxial about the connecting body 230. The upper section 215 and lower section 217 may be sealed to connecting body 230 using frictional fit, using sealing materials such as gaskets or putty adapted to withstand high temperatures, or by using adhesives such as pressure sensitive adhesives, ceramic bonding, glue, and the like that are process resistant and free of contaminates such as copper. The upper section 215 and lower section 217 may be connected to connecting body 230 by conventional means such as welding, or by using bolts, clamps or other fasteners as are known in the art.

The heating chamber 140 is mounted on a mounting frame 255 to provide support for the upper section 215 and lower section 217. In one aspect, the mounting frame 255 may comprise rotatably mounted casters 245, 246, and 247 on a lower end for moving the heating chamber 140. The mounting frame 255 may be attached to the heating chamber 140 and connecting body 230 by conventional means such as bolts, clamps or other fasteners as are known in the art. While the heating chamber 140 is preferably mounted on frame 255, the heating chamber 140 may be mounted to and supported by the transfer chamber 110 using fasteners such as screws, bolts, clips, and the like.

A motor 285 used with the transportation of substrates within the heating chamber 140, may be attached to the heating chamber 140 using fasteners such as screws, bolts, clips, and the like. The motor 285 is rotatably coupled to a lead screw 288. The lead screw 288 is rotatably coupled to a platform 287 slidably coupled to the frame 255. When the lead screw 288 is rotated by the motor 285, the platform 287 is vertically raised or lowered.

In one embodiment, a thermal insulating layer (not shown) may be used to enclose, or wrap, the heating chamber 140 to minimize heat loss from the heating chamber 140. The thermal insulating layer may comprise insulators such as fiberglass, ceramic fiber, asbestos, or other materials adapted to provide insulation from heat loss. In one embodiment, the insulating layer comprises a flexible insulating ceramic fiber blanket having a thermal conductivity of less than about 0.035 watt/m° K. and stabilizes at a surface temperature of about 30° C.

Figure 3:
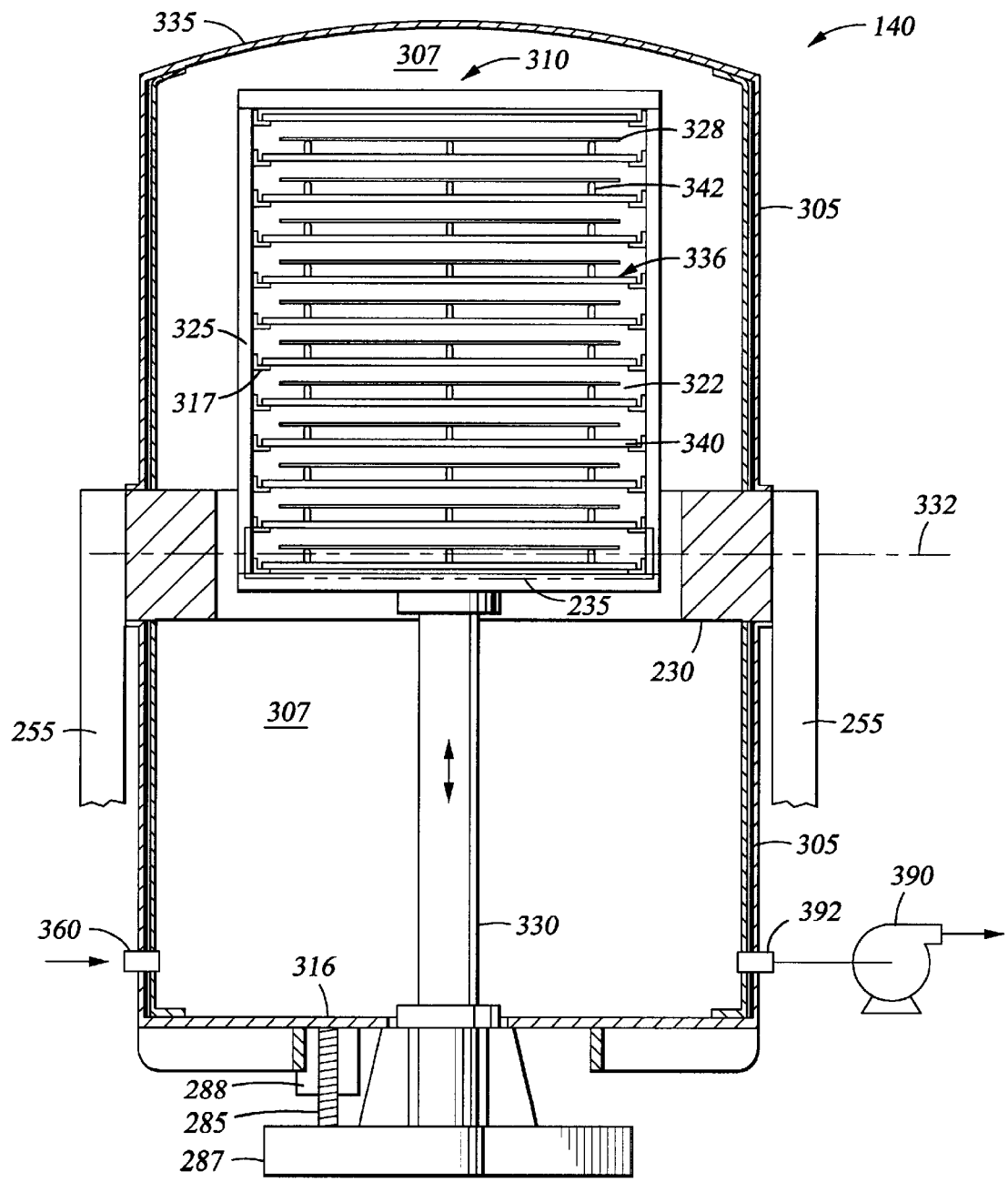
FIG. 3 is a partial cross-sectional view of the heating chamber of FIG. 1 illustrating an upper and lower bell jar configuration.

FIG. 3 is a cross-section of one embodiment of a heating chamber 140 of the invention adapted for substrate heat processing. The heating chamber 140 comprises a body 305, a lid 335 and bottom 316 disposed on the body 305 and defining a cavity 307 for heating a plurality of substrates 328 therein. In one aspect, the body 305 is formed of process resistant materials such as aluminum, steel, nickel, and the like, adapted to withstand process temperatures and is generally free of contaminates such as copper. The body 305 may comprise a gas inlet 360 extending into the cavity 307 for connecting the heating chamber 140 to a process gas supply (not shown) for delivery of processing gases therethrough. In another aspect, a vacuum pump 390 may be coupled to the cavity 307 through a vacuum port 392 to maintain a vacuum within the cavity 307.

A substrate cassette 310 is moveably disposed within the cavity 307 and is coupled to an upper end of a movable member 330. The moveable member 330 is comprised of process resistant materials such as aluminum, steel, nickel, and the like, adapted to withstand process temperatures and generally free of contaminates such as copper. The movable member 330 enters the cavity 307 through the bottom 316. The movable member 330 is slidably and sealably disposed through the bottom 316 and is raised and lowered by the platform 287. The platform 287 supports a lower end of the movable member 330 such that the movable member 330 is vertically raised or lowered in conjunction with the raising or lowering of the platform 287. The movable member 330 vertically raises and lowers the cassette 310 within the cavity 307 to move the substrates 328 across a substrate transfer plane 332 extending through the window 235. The substrate transfer plane 332 is defined by the path along which substrates are moved into and out of the cassette 310 by the robot 113.

The cassette 310 comprises a plurality of substrate-heating shelves 336 supported by a frame 325. Although in one aspect, FIG. 3 illustrates twelve substrate-heating shelves 336 within cassette 310, it is contemplated that any number of shelves may be used. Each substrate-heating shelf 336 comprises a heated substrate support 340 (e.g., heating plate) connected by brackets 317 to the frame 325. The brackets 317 connect the edges of the heated substrate support 340 to the frame 325 and may be attached to both the frame 325 and heated substrate support 340 using adhesives such as pressure sensitive adhesives, ceramic bonding, glue, and the like, or fasteners such as screws, bolts, clips, and the like that are process resistant and are free of contaminates such as copper. The frame 325 and brackets 317 are comprised of process resistant materials such as ceramics, aluminum, steel, nickel, and the like that are process resistant and are generally free of contaminates such as copper. While the frame 325 and brackets 317 may be separate items, it is contemplated that the brackets 317 may be integral to the frame 325 to form support members for the heated substrate supports 340. While, in one aspect, the heated substrate supports 340 are conformal to and slightly larger than the substrates 328 to maximize heating efficiency by applying a majority of the heat to the substrate 328, it is contemplated that the heated support 340 may be of any shape adapted to provide desired substrate heating. For example, in one embodiment the heated support 340 may be considerably larger than the substrate 328 to ensure that the substrate 328 is fully exposed to the heat from the support 340. Alternatively, the heated support 340 may be formed to accommodate substrates 328 of various sizes.

The substrate-heating shelves 336 are spaced vertically apart and parallel within the cassette 310 to define a plurality of substrate-heating spaces 322. Each substrate-heating space 322 is adapted to heat at least one substrate 328 therein supported on a plurality of support pins 342. The substrate-heating shelves 336 above and below each substrate 328 establish the upper and lower boundary of the substrate-heating space 322 such that the top and bottom sides of the substrate 328 are exposed to heat. In one embodiment, the upper and lower boundaries are equidistant from the substrate 328 in order to ensure uniform heating of both sides of the substrate 328. To ensure heating of the top substrate 328 in the cassette 310, the upper boundary for the top heating space 322 is established by an empty heated substrate support 340. In another embodiment, the spacing and substrate position may be adjusted to accommodate different heating requirements for different processes such as annealing, hydrogen removal, and the like. The spacing between the upper and lower boundary of the heating space 322 may be adjusted to increase or decrease the rate of heating, and the amount of heat applied to each substrate side. For example, the spacing between the upper and lower boundary of the heating space 322 can be spaced more narrowly to increase the radiant energy from the heated substrate supports 340 to thereby increase the temperature and rate of heating, or spaced further apart to reduce the incident radiant energy, thereby lowering the substrate temperature and slowing the heating of the substrate 328. Moreover, the substrate 328 may be positioned closer to either the upper or the lower boundary to provided differing amounts of heating to either side of the substrate 328. In one aspect, to increase production efficiency, the spacing between the upper and lower boundary of the heating space 322 may be adjusted to heat the substrate 328 at a desired rate and temperature while allowing the cassette 310 to hold as many substrate-heating shelves 336 as possible. In one aspect, the spacing between the upper and lower boundary is about 45 mm. The inventors believe that the about 45 mm spacing between the upper and lower boundary provides for adequate space to receive a substrate 328, uniform substrate heating, and efficient space utilization within the chamber 307 to maximize the number of substrate-heating shelves 336.

Figure 4:
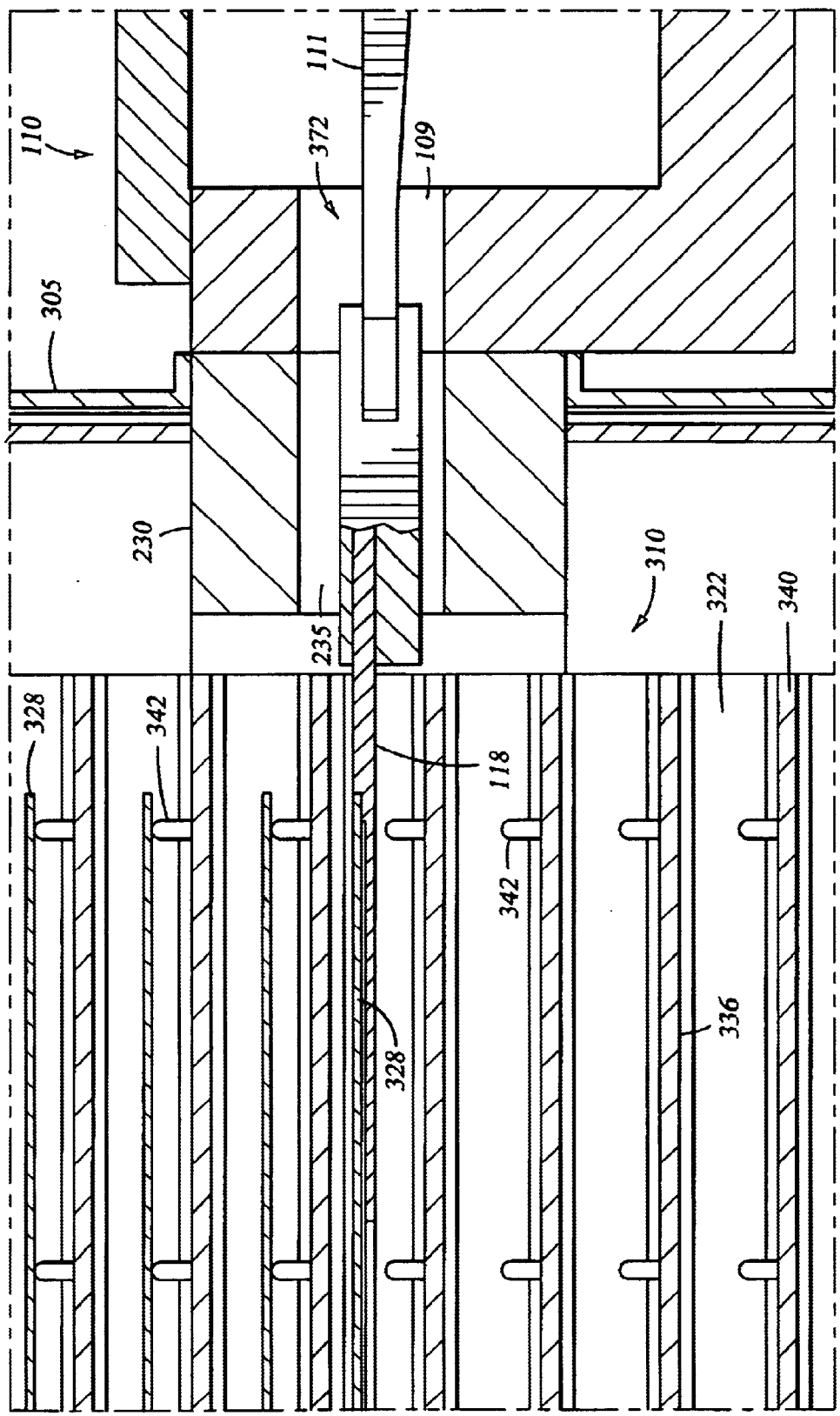
FIG. 4 is a partial cross-sectional view of the heating chamber and transfer chamber of FIG. 1.

FIG. 4 illustrates a cross-sectional view of the heating chamber 140 and transfer chamber 110. The heating chamber 140 is positioned so that the window 235 is registered with an opening 109 formed in the sidewall of transfer chamber 110. In such a position, the transfer chamber opening 109 and the window 235 define a substrate transfer aperture 372 through which substrates 328 may be transferred by robot 113. The substrate transfer aperture 372 is selectively sealed by a sealing apparatus such as a gate valve or slit valve (not shown). During operation, the robot 113 receives a substrate 328 on a blade 118 supported on arms 111 from the processing system 100 via the transfer chamber 110 through the substrate transfer aperture 372. The blade 118 is positioned to deliver the substrate 328 to the heating chamber 140 through the substrate transfer aperture 372. The cassette 310 is moved vertically up or down to position an empty heating space 322 inline with the substrate transfer plane 332 to receive the substrate 328. The arms 111 are extended through the substrate transfer aperture 372 to dispose the substrate 328 within the heating chamber 140 and subsequently dispose the substrate 328 within cassette 310. The arms 111 extend the substrate 328 into the heating space 322 and position the substrate 328 above the pins 342. In one embodiment, the cassette 310 moves vertically until the pins 342 contact the substrate surface, lifting the substrate 328 off the blade 118. Subsequently the arms 111 and blade 118 are retracted back to the transfer chamber 110. In another embodiment, the arms 111 and blade 118 move vertically downwardly until the substrate 328 contacts the pins 342. The arms 111 and blade 118 continue to move downwardly until the substrate 328 is fully supported by the pins 342.

Figure 5:
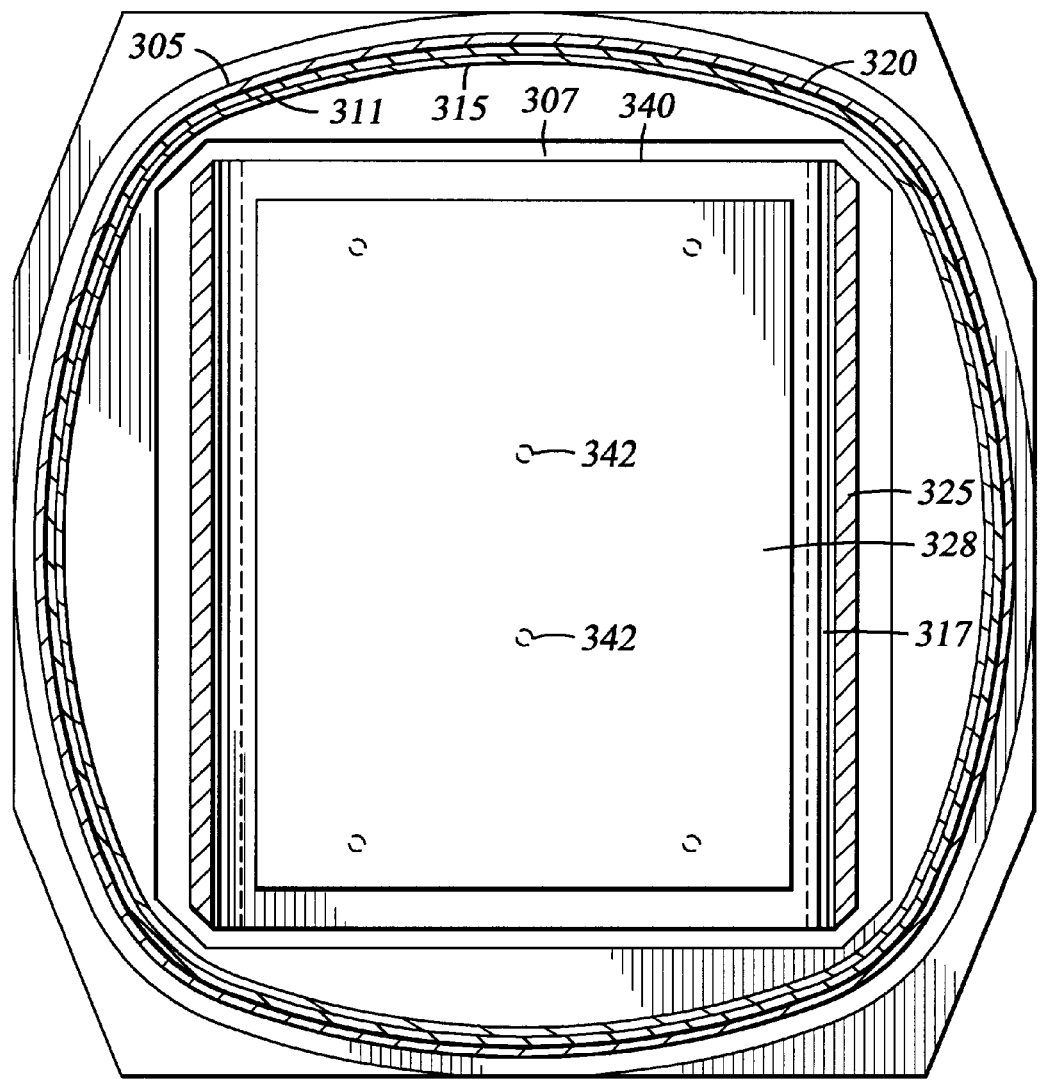
FIG. 5 is a partial cross-sectional view of the heating chamber of FIG. 1 illustrating the body, heat reflector, and heater.

FIG. 5 is a cross-section top view of the heating chamber 140 illustrating one embodiment of the invention. Because the cavity 307 holds a plurality of substrates 328, the cavity 307 is typically larger in volume than chambers such as processing chambers 114 and holding chamber 116, which usually hold only one substrate 328. Because of the increased volume of the cavity 307, external atmospheric pressures on the chamber 140 under vacuum may be considerable. To provide structural strength and to minimize the cavity volume, the cavity 307 is preferably semi-round in shape and is conformal with and slightly larger than the cassette 310. In other embodiments, it is contemplated that the shape of the cavity 307 may be round, square, or any shape adapted to accommodate the substrate 328 and to have sufficient structural integrity to withstand the external atmospheric pressures.

Figure 6:
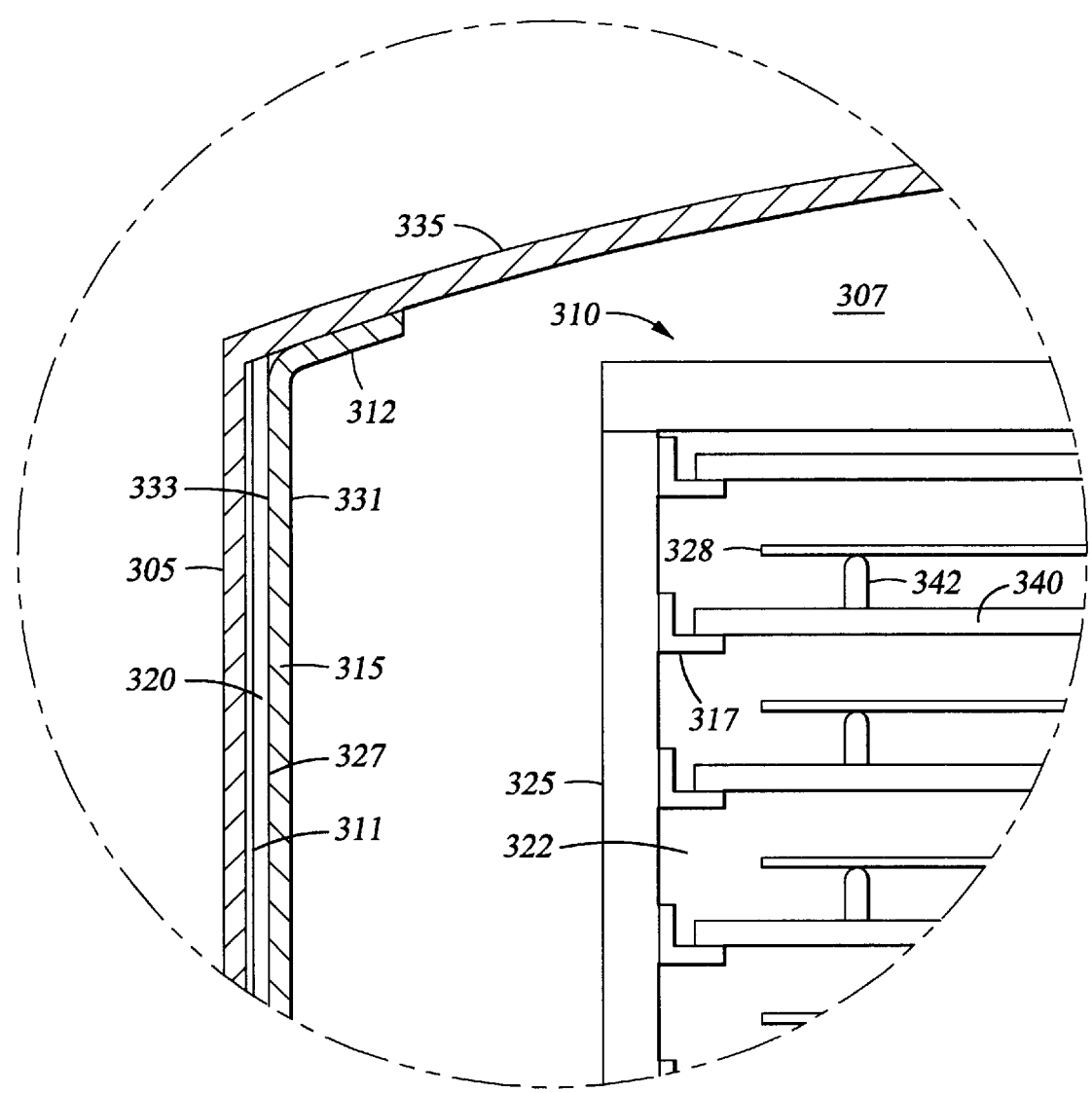
FIG. 6 is a top cross-sectional view of the heating chamber of FIG. 5.

FIG. 6 is a partial cross-sectional view of the heating chamber 140. A heat reflector 320 is disposed within cavity 307 and spaced adjacent an inner surface 311 of body 305, forming a reflective surface within the cavity 307. The heat reflector 320 is adapted to minimize conductive heat losses through the body 305 by providing radiant heat insulation between the cavity 307 and the inner surface 311. The heat reflector 320 reflects radiated heat within the cavity 307 away from the inner surface 311 and toward the center of the cavity 307. The heat reflector 320 may comprise a single layer. Alternatively, the heat reflector 320 may comprise multiple layers, or several pieces combined to form a unified body. The heat reflector 320 typically comprises heat conductors such as aluminum, nickel, steel, and the like that are process resistant and generally free of contaminates such as copper. When additional insulation is desired between the cavity 307 and the inner surface 311, the heat reflector 320 comprises insulators such as metal plated ceramics, glass, and the like that are process resistant and generally free of contaminates such as copper. The heat reflector 320 comprises an inner heat reflective surface 327 plated with aluminum, nickel, gold, or other surfaces adapted to reflect heat and that are process resistant and generally free of contaminates such as copper. The heat reflector 320 may be attached to the inner surface 311 using several methods such as bonding to the inner surface 311 using pressure sensitive adhesives, ceramic bonding, glue, and the like, or by fasteners such as screws, bolts, clips, and the like that are process resistant and generally free of contaminates such as copper. Additionally, the heat reflector 320 can be deposited on the inner surface 311 using techniques such as electroplating, sputtering, anodizing, and the like. In one embodiment, the heat reflector 320 is spaced from the inner surface 311 using insulated fasteners such as insulated screws, bolts, clips, and the like, forming a gap therebetween the inner surface 311 and the heat reflector 320.

A heater 315 is disposed within the cavity 307 between the heat reflector 320 and the cassette 310. The heater 315 is adapted to form a heating member conforming to and surrounding the cassette 310. The heater 315 comprises one or more heating elements such as resistive heaters, heating lamps, and the like disposed within a layer, or layers, of heat conducting materials such as nickel, steel, aluminum, and the like that radiate heat. Although, the inside surface 331 of the heater 315 is preferably bead blasted or anodized to provided a higher heat emissivity to improve the transmission of radiated heat within the cavity 307, other types of surface conditioning adapted to provided greater surface emissivity may be used. The outer surface 333 of the heater 315 is polished to provide a low emissivity, thereby minimizing the transmission of radiated heat to the chamber body 305. During substrate heat processing, the heater 315 is activated by a power source (not shown) and heated to a desired temperature. Although, in one aspect, a gap is established between the heater 315 and the heat reflector 320 to minimize heat transference via conduction to the heat reflector 320, the heater 315 may be in direct contact with heat reflector 320.

Figure 7:
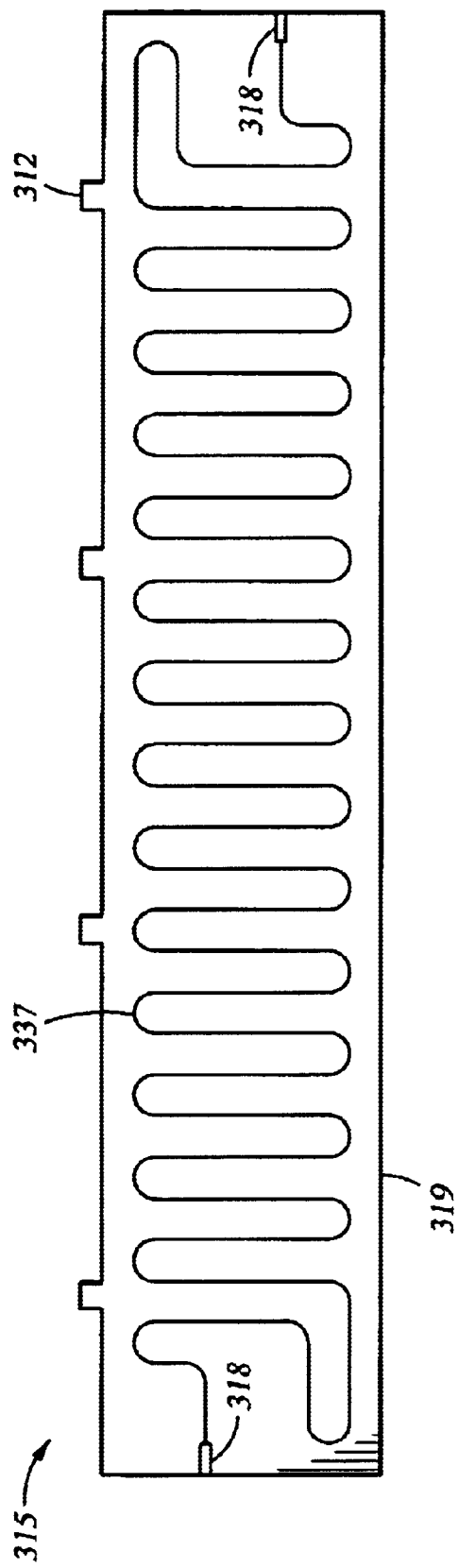
FIG. 7 is a side view of a heater used with the heating chamber of FIG. 5.
Figure 8:
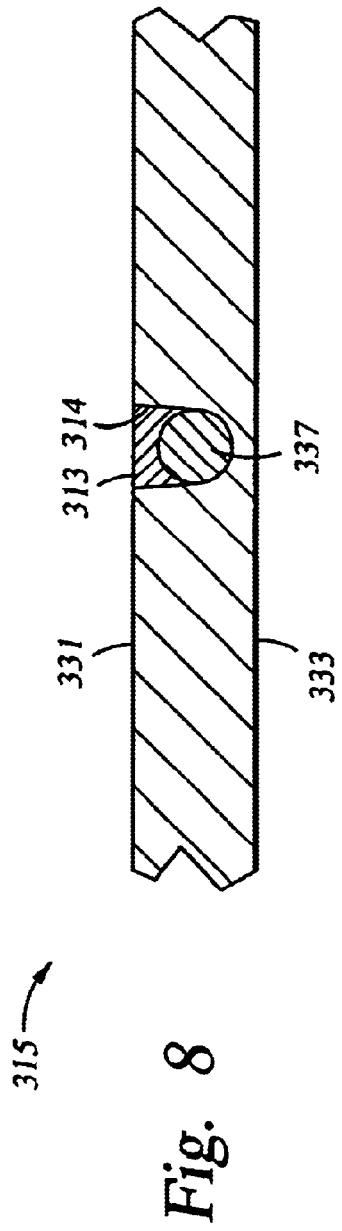
FIG. 8 is a partial cross-section of a heater used with the heating chamber of FIG. 5.

FIGS. 7 and 8 illustrate one embodiment of the heater 315 that may be used to advantage. The heater 315 comprises a jacket 319 comprising thermally conducting materials such as aluminum, nickel, steel, and the like adapted to uniformly radiate heat within the cavity 307 and that are process resistant and generally free of contaminates such as copper. A continuous heating element 337 is disposed within slot 314 formed within the jacket 319. The continuous heating element 337 is adapted to radiate heat within the jacket 319.

The continuous heating element 337 may be secured within slot 314 by frictional fit, by welding, using fill materials 313 generally free of contaminates such as copper and/or silver, or by using adhesives such as pressure sensitive adhesives, ceramic bonding, glue, and the like, or fasteners such as screws, bolts, clips, and the like that are process resistant and generally free of contaminates such as copper. In one embodiment, to provide a tighter fit between the jacket 319 and the continuous heating element 337, the continuous heating element 337 has a higher coefficient of expansion than that of the jacket 319. Although, in one aspect, the thermal expansion coefficient for the continuous heating element 337 is about $\alpha=17$, and the thermal expansion coefficient for the jacket 319 is about $\alpha=13$ other thermal expansion coefficients may be used to advantage.

A pair of couplings 318 are connected to a power source (not shown), such as an external power supply, to provide power to the continuous heating element 337. Although it is preferred that the continuous heating element 337 be formed as a unified and homogenous heating member to provided uniform heating throughout the jacket 319, a plurality of individual heating elements such as restive heaters, lamps and the like, may be coupled together to form the continuous heating element 337. Additionally, the jacket 319 may be heated by a plurality of the individual heaters dispersed and coupled discretely throughout jacket 319.

The heater 315 may be secured within the cavity 307 using any of several methods. For example, the heater 315 may be attached to the inner surface 311 using attachment methods such as bonding using adhesives such as pressure sensitive adhesives, ceramic bonding, glue, and the like, or fasteners such as screws, bolts, clips, and the like that are process resistant and generally free of contaminates such as copper. In a particular embodiment, the heater 315 comprises an upper portion having a mounting flange 312 for mounting the heater 315 to the body 305. Although it is preferred that the mounting flange 312 be integral to the heater 315, the mounting flange 312 may be a separate component. The mounting flange 312 may be attached to the body 305 using adhesives such as pressure sensitive adhesives, ceramic bonding, glue, and the like, or fasteners such as screws, bolts, clips, and the like that are process resistant and generally free of contaminates such as copper.

Figure 9:
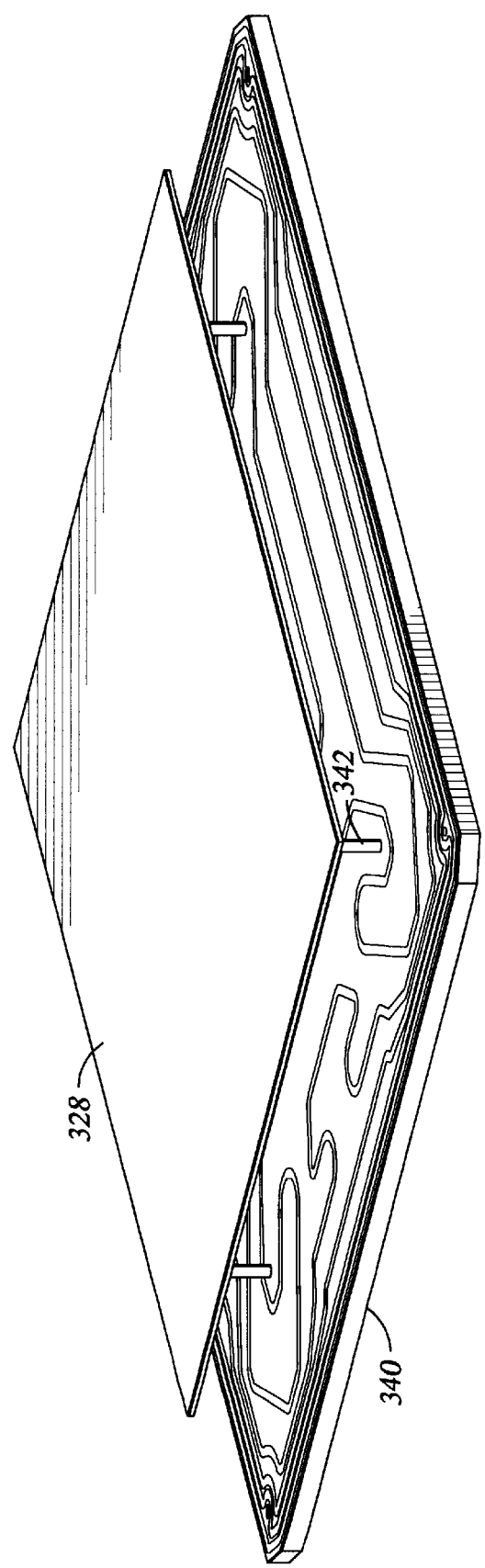
FIG. 9 is a perspective view of a heated substrate support used with the heating chamber of FIG. 5.

FIG. 9 illustrates one embodiment of the invention where the heated substrate support 340 and the support pins 342 space and support the substrate 328 thereon forming a lower portion of the heating space 322. Although, in one aspect, the number of support pins 342 is at least six, having four support pins 342 spaced substantially uniformly on the substrate outer periphery to fully support the edges and two support pins 342 adjacent the middle of the substrate 328, as illustrated in FIG. 5. Alternatively, any number of support pins 342 may be used in any configuration adapted to support the substrate 328. The supporting pins 342 preferably comprises insulators such as polymers, ceramics, and the like with a cross section adapted to minimize contact with the substrate 328 and to prevent conduction between the heated substrate support 340 and the substrate 328. For additional supporting strength the supporting pins 342 may also comprise conductors such as steel, aluminum, nickel, and the like having a sufficiently small surface area to minimize conduction, that are process resistant, and generally free from contaminates such as copper. While in one aspect the support pins 324 comprise a pointed tip to minimize contact with substrate 328, the support pins 328 may have any tip cross section and profile adapted to support the substrate 328 such as rounded tip, square tip, flat tip, and the like adapted to minimize heat conduction to the heated substrate support 340.

Figure 10:
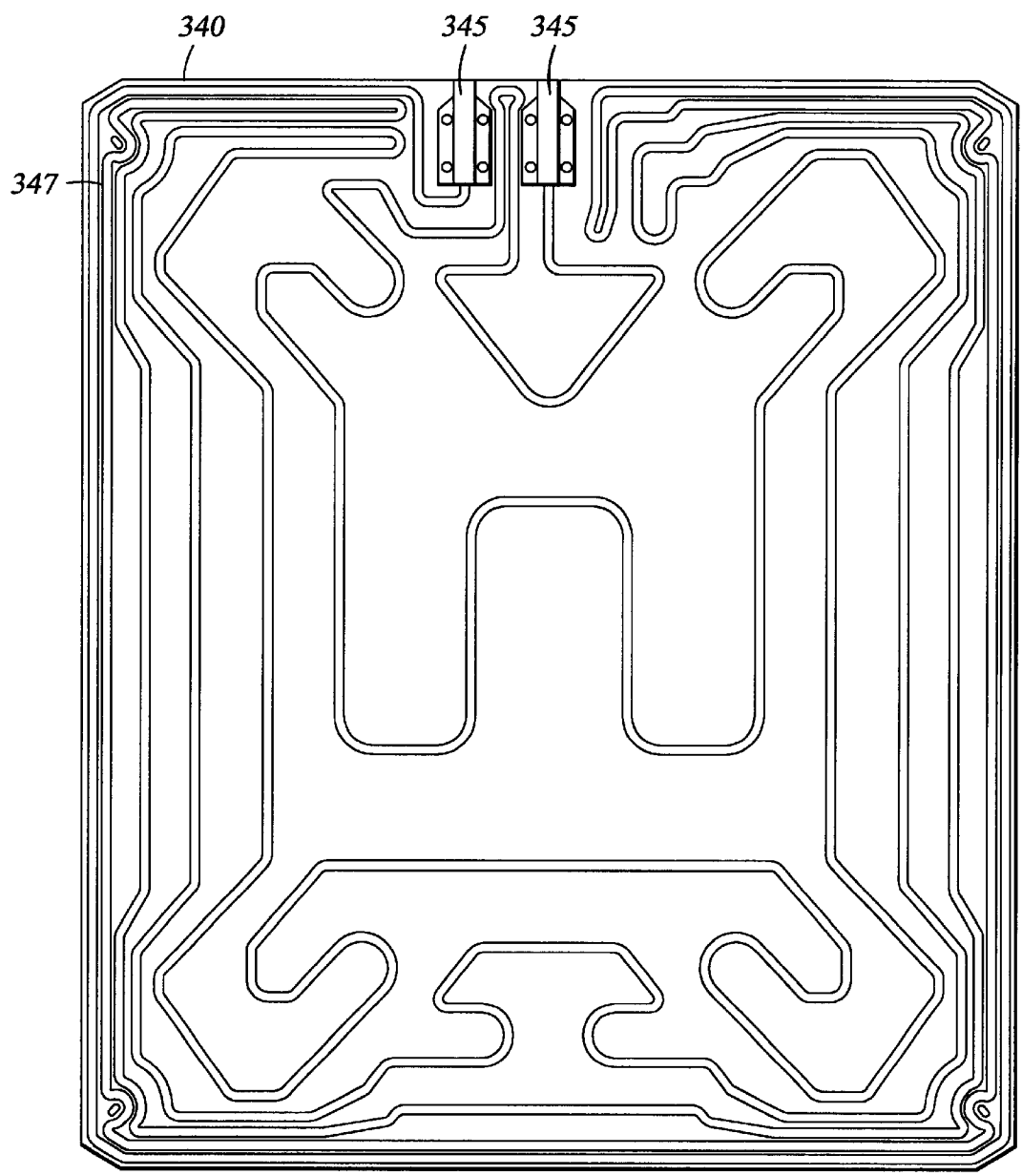
FIG. 10 is a top view of a heated substrate support used with the heating chamber of FIG. 5.

FIG. 10 is a top view of the heated substrate support 340 comprising a plurality of plate heaters 347 disposed within a layer of thermally and electrically insulating material such as fiberglass, glass, ceramic, asbestos, and the like. The plate heaters 347 may be resistive heaters, radiant lamps, and the like. The plate heaters 347 may be activated by power supplied by a power source (not shown) such as an external power supply coupled through connectors 345. Typically, the temperature across the substrate surfaces varies as a function of the substrate body heat migration due to convection and conduction within the chamber 140, proximity to the heated substrate support 340, the support pins 342, the heater 315, and the overall thermal profile within the cavity 307. In one embodiment, the plate heaters 347 are patterned to provide a radiant heating profile to match and compensate for substrate thermal losses, i.e. the substrate heat loss profile. For example, the plate heaters 347 illustrated in FIG. 10 are spaced closer together near the corners than the middle of the heated substrate support 340 to provide more concentrated heat to the corners and edges of the substrate 328 where a substantial amount of conductive and/or radiated heat loss occurs. Although, heat typically tends to radiate from the substrate edges, it is contemplated that the patterned heating profile may be adapted to encompass any variation in the substrate heat loss profile. For example, the plate heaters 347 may be adapted to provide a variable amount of heat output by varying their size, spacing, resistivity, illumination, input power, and the like to more closely fit the substrate heat loss profile. Moreover, the heated substrate support 340 is spaced from the substrate 328 by the support pins 342 as shown in FIGS. 3, 4, and 6 to allow the radiated heat between the lower surface of the substrate 328 and upper surface of the heated support to intermix. Although, in one aspect the spacing between the heated substrate support 340 and the substrate 328 is about 20 mm, other spacings are contemplated. Although it is believed that the radiant heat from the heated substrate support 340 intermixes before heating the substrate 328, thereby minimizing hotspots defined by the plate heater configuration, it is also contemplated that the substrate 328 may be laid directly on a heated substrate support 340 with plate heaters adapted to substantially match the substrate heat loss profile.

In operation, the heating chamber 140 heating process is initiated by the robot 113 placing the substrate 328 via window 235 within cavity 307 on a heated substrate support 340. An inert process gas, such as nitrogen, is flowed into the cavity 307 through the gas inlet 360 and is maintained at a required chamber pressure by the vacuum pump 390. Alternatively, the process gas may be an active process gas, such as fluorine, adapted for a particular process. The cavity 307 is heated with radiant heat by the heater 315 and heated substrate support 340, or heater 315 alone, in cooperation with the heat reflector 320, to a desired ambient level sufficient to provide a uniform substrate heating profile. The individual substrates 328 are uniformly heated to a substrate body temperature between about 350° C. to about 600° C. The temperature variation referenced to a temperature on the substrate body (i.e., normalized temperature variation) is about between +/−5° C. and about +/−10° C.

Figure 11:
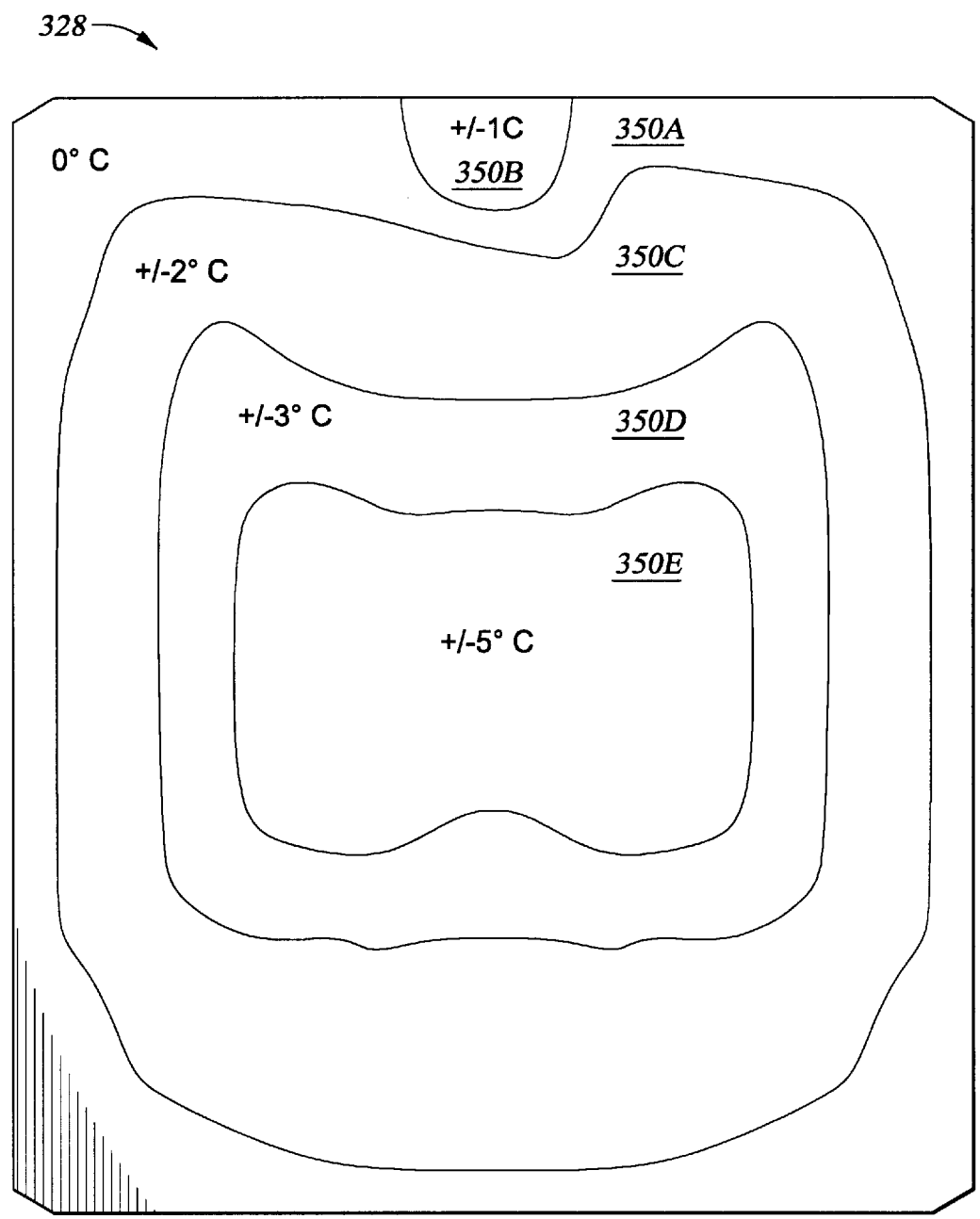
FIG. 11 is a temperature contour of a substrate undergoing heat treatment within the heating chamber of FIG. 5.

For example, in one method of operation in accordance with the invention the heating chamber 140 heating process is initiated by the robot 113 placing the substrate 328 via window 235 within cavity 307 on a heated substrate support 340. A vacuum within the cavity 307 is provided by vacuum pump 390 at about 0 to about 0.5 Torr. A process gas such as nitrogen is flowed into the cavity 307 through the gas inlet 360 and is maintained at chamber pressure at about 0.0 Torr to about 0.5 Torr by the vacuum pump 390. Heat is applied to the substrates via heater 315 and heated supports 340 to heat each substrate uniformly to a temperature of about 450° C. to about 600° C. each. Each substrate maintains a normalized heating profile of about +/−5° C. at a substrate body temperature of about 450° C. to about +/−10° C. at a substrate body temperature of about 600° C. For example, FIG. 11 is an illustrative temperature contour map of a substrate 328 illustrating the normalized temperature variation across the body of the substrate 328, using the perimeter temperature as the normalizing value, during heat processing at about 500° C. Region, 350A, is the reference region and therefore has a zero temperature variance. Region, 350B, has about a +/−1° C. normalized temperature variation. Region 350C has about a +/−2° C. normalized temperature variation. Region 350D has about a +/−3° C. normalized temperature variation. Region 350E has about a +/−5° C. normalized temperature variation. Thus, the normalized temperature variation across the substrate 328 is about +/−5° C.

While foregoing is directed to the embodiments of the invention, other and further embodiments of the invention may be devised without departing from the basic scope thereof, and the scope thereof is determined by the claims that follow.

What is claimed is:

1. An apparatus for heating substrates, comprising:
   a chamber having a body, a bottom portion, and a lid;
   a heat reflector disposed within the chamber;
   a heater disposed within the chamber adjacent to the heat reflector and coupled to the body of the chamber; and
   a plurality of heated supports movably disposed within the chamber to support at least two substrates thereon.

2. The apparatus of claim 1, wherein the chamber, the heat reflector, and the heated supports comprise nickel.

3. The apparatus of claim 1, wherein the chamber walls are slightly larger than and conformal with the heated supports.

4. The apparatus of claim 1, wherein the heater substantially surrounds the heated supports.

5. The apparatus of claim 1, further comprising a pump coupled to the chamber to maintain a vacuum therein.

6. The apparatus of claim 1, further comprising a plurality of heater elements disposed within the heater.

7. The apparatus of claim 6, wherein the heater elements are selected from the group consisting of resistive heaters, radiant lamps, and combinations thereof.

8. The apparatus of claim 1, wherein the heat reflector comprises a heat reflective surface.

9. The apparatus of claim 8, wherein the heat reflector comprises materials selected from the group consisting of glass, ceramics, and combinations thereof.

10. The apparatus of claim 8, wherein the heat reflector comprises materials selected from the group consisting of aluminum, nickel, steel, and combinations thereof.

11. The apparatus of claim 8, wherein the heat reflective surface is selected from the group consisting of aluminum, nickel, gold, and combinations thereof.

12. The apparatus of claim 1, further comprising at least one insulating layer disposed about the chamber.

13. The apparatus of claim 1, wherein at least one of the heated supports comprises a plurality of heating elements.

14. The apparatus of claim 13, wherein the heating elements are selected from the group consisting of resistive heaters, radiant lamps, and combinations thereof.

15. An apparatus for heating substrates, comprising:
a chamber having a cavity;
at least one cassette having a plurality of heated supports movably disposed within the cavity and capable of supporting a plurality of substrates;
a heating layer disposed within the cavity, coupled to the chamber, and positioned to provide radiant heat to the at least one cassette; and
a heat reflector disposed within the cavity and surrounding at least a portion of the heated supports to form a reflective surface directed into the cavity.

16. The apparatus of claim 15, wherein the heating chamber, heated supports, heat reflector, and heating layer are about free of copper.

17. The apparatus of claim 15, wherein the cavity is about conformal with the heated supports.

18. The apparatus of claim 15, wherein the heating layer substantially surrounds the heated supports.

19. The apparatus of claim 15, wherein the heat reflector comprises a heat reflective surface.

20. The apparatus of claim 15, further comprising a pump coupled to the chamber to maintain a vacuum therein.

21. The apparatus of claim 15, wherein the heated supports are adapted to uniformly heat the plurality of substrates.

22. The apparatus of claim 21, wherein the heated supports comprise a plurality of heating elements arranged thereon to form a heating profile about consistent with a heat loss profile of one or more of the plurality of substrates heated within the cavity.

23. The apparatus of claim 1, wherein the heater comprises a material selected from the group consisting of nickel, steel, aluminum, and combinations thereof.

24. The apparatus of claim 1, wherein the heat reflector comprises an inner heat reflective surface which is adjacent to the heater and plated with a material selected from the group consisting of nickel, steel, aluminum, gold and combinations thereof.

25. The apparatus of claim 1, wherein the heat reflector comprises an insulating material selected from the group consisting of metal plated ceramics, glass, and combinations thereof.

26. An apparatus for heating substrates, comprising:
a chamber having a body, a bottom portion, and a lid;
a heat reflector disposed within the chamber;
a heater disposed within the chamber adjacent to the heat reflector and coupled to the body of the chamber, the heater having an inner surface and an outer surface, wherein the heat emissivity value of the inner surface is greater than the heat emissivity value of the outer surface; and
a plurality of heated supports movably disposed within the chamber to support at least two substrates thereon.

27. An apparatus for heating substrates, comprising:
a chamber having a body, a bottom portion, and a lid;
a heat reflector disposed within the chamber;
a heater disposed within the chamber adjacent to the heat reflector and coupled to the body of the chamber;
a plurality of heated supports movably disposed within the chamber to support at least two substrates thereon; and
at least one insulating layer disposed about the chamber, wherein the insulating layer comprises a flexible ceramic fiber blanket having thermal conductivity of less than about 0.053 watt/m° K.

28. An apparatus for heating substrates, comprising:
a chamber having a cavity;
at least one cassette having a plurality of heated supports movably disposed within the cavity and capable of supporting a plurality of substrates;
a heating layer disposed within the cavity, coupled to the chamber, and positioned to provide radiant heat to the at least one cassette, the heating layer having an inner surface and an outer surface, wherein the heat emissivity value of the inner surface is greater than the heat emissivity value of the outer surface; and
a heat reflector disposed within the cavity and surrounding at least a portion of the heated supports to form a reflective surface directed into the cavity.

29. An apparatus for heating substrates, comprising:
a chamber having a cavity;
at least one cassette having a plurality of heated supports movably disposed within the cavity and capable of supporting a plurality of substrates;
a heating layer disposed within the cavity, coupled to the chamber, surrounding the at least one cassette, and positioned to provide radiant heat to the at least one cassette; and
a heat reflector disposed within the cavity and surrounding the heating layer to form a reflective surface directed into the cavity.

* * * * *